US012635580B2

(12) United States Patent
Joo et al.

(10) Patent No.: US 12,635,580 B2
(45) Date of Patent: May 19, 2026

(54) SEMICONDUCTOR PACKAGES

(71) Applicant: Samsung Electronics Co., Ltd.,
Suwon-si (KR)

(72) Inventors: Changeun Joo, Suwon-si (KR); Ohguk Kwon, Suwon-si (KR); Sunjae Kim, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 415 days.

(21) Appl. No.: 18/136,499

(22) Filed: Apr. 19, 2023

(65) Prior Publication Data

US 2024/0055403 A1 Feb. 15, 2024

(30) Foreign Application Priority Data

Aug. 11, 2022 (KR) ........................ 10-2022-0100709

(51) Int. Cl.
H01L 23/00 (2006.01)
H01L 23/31 (2006.01)
(Continued)

(52) U.S. Cl.
CPC ...... H01L 25/0657 (2013.01); H01L 23/3128 (2013.01); H01L 23/481 (2013.01);
(Continued)

(58) Field of Classification Search
CPC ............. H01L 25/0657; H01L 23/3128; H01L 23/481; H01L 23/5383; H01L 24/16;
(Continued)

(56) References Cited

U.S. PATENT DOCUMENTS

| | | |
|---|---|---|
| 8,754,514 B2 | 6/2014 | Yu et al. |
| 8,754,515 B2 | 6/2014 | Kim et al. |
| | (Continued) | |

FOREIGN PATENT DOCUMENTS

| | | |
|---|---|---|
| KR | 10-2022-0016689 A | 2/2022 |
| KR | 10-2022-0067212 A | 5/2022 |
| | (Continued) | |

*Primary Examiner* — Elias Ullah
(74) *Attorney, Agent, or Firm* — Wolf, Greenfield & Sacks, P.C.

(57) ABSTRACT

A semiconductor package may include a first redistribution substrate, a second redistribution substrate on the first redistribution substrate, a chip stack between the first redistribution substrate and the second redistribution substrate, a first molding layer on the chip stack, and a through electrode extending into the first molding layer and electrically connecting the first redistribution substrate to the second redistribution substrate. The chip stack may include a first semiconductor chip on the first redistribution substrate, the first semiconductor chip including a through via that extends therein, a chip structure including a second semiconductor chip and a second molding layer, the second semiconductor chip being on the first semiconductor chip and electrically connected to the through via, and a third semiconductor chip between the chip structure and the second redistribution substrate, and a side surface of the first semiconductor chip may be coplanar with a side surface of the chip structure.

20 Claims, 22 Drawing Sheets

10

(51) Int. Cl.

| | |
|---|---|
| *H01L 23/48* | (2006.01) |
| *H01L 23/538* | (2006.01) |
| *H01L 25/065* | (2023.01) |

(52) U.S. Cl.

CPC .......... *H01L 23/5383* (2013.01); *H01L 24/16* (2013.01); *H01L 24/32* (2013.01); *H01L 24/73* (2013.01); *H01L 2224/16146* (2013.01); *H01L 2224/16227* (2013.01); *H01L 2224/32145* (2013.01); *H01L 2224/73253* (2013.01); *H01L 2225/06568* (2013.01)

(58) Field of Classification Search

CPC ...................... H01L 24/32; H01L 24/73; H01L 2224/16146; H01L 2224/16227; H01L 2224/32145; H01L 2224/73253; H01L 2225/06568; H01L 24/81; H01L 25/03; H01L 2224/16145; H01L 2221/68345; H01L 2221/68359; H01L 2224/08145; H01L 21/561; H01L 21/6835; H01L 23/5389; H01L 24/20; H01L 21/568; H01L 2224/73204; H01L 23/49816; H01L 24/08; H01L 24/19; H01L 25/50; H01L 21/56; H01L 23/49827; H01L 23/49838; H01L 23/5386; H01L 25/18; H01L 24/02; H01L 24/31; H01L 2224/02331; H01L 2224/02381; H01L 2225/06513; H01L 2225/06524; H01L 2225/06527; H01L 2225/06541; H01L 2225/06548; H10B 80/00

See application file for complete search history.

(56) References Cited

U.S. PATENT DOCUMENTS

| | | | |
|---|---|---|---|
| 8,907,498 B2 | 12/2014 | Pagaila et al. | |
| 9,224,647 B2 | 12/2015 | Koo et al. | |
| 9,837,378 B2 | 12/2017 | Khan et al. | |
| 9,935,087 B2 | 4/2018 | Zhai et al. | |
| 10,050,016 B2 | 8/2018 | Lee et al. | |
| 10,056,351 B2 | 8/2018 | Yu et al. | |
| 10,373,940 B2 | 8/2019 | Lee | |
| 10,867,966 B2 | 12/2020 | Chen et al. | |
| 11,075,151 B2 | 7/2021 | Tsai et al. | |
| 11,133,282 B2 | 9/2021 | Yu et al. | |
| 11,387,225 B2 | 7/2022 | Kang et al. | |
| 2016/0086912 A1 | 3/2016 | Lee | |
| 2017/0141088 A1* | 5/2017 | Zhai ...................... | H01L 21/561 |
| 2020/0111671 A1 | 4/2020 | Hunt et al. | |
| 2022/0189854 A1 | 6/2022 | Cho et al. | |
| 2022/0223512 A1 | 7/2022 | Kuo et al. | |

FOREIGN PATENT DOCUMENTS

| | | | |
|---|---|---|---|
| TW | 201246482 A | 11/2012 | |
| TW | 202002227 A | 1/2020 | |
| TW | 202046416 A | 12/2020 | |
| TW | 202107643 A | 2/2021 | |

* cited by examiner

SEMICONDUCTOR PACKAGES

CROSS-REFERENCE TO RELATED APPLICATIONS

This U.S. non-provisional patent application claims priority under 35 U.S.C. § 119 to Korean Patent Application No. 10-2022-0100709, filed on Aug. 11, 2022, in the Korean Intellectual Property Office, the entire contents of which are hereby incorporated by reference.

BACKGROUND OF THE INVENTION

The inventive concept relates to semiconductor packages, and more particularly, to semiconductor packages including a plurality of semiconductor chips as one package and methods for manufacturing the same.

A semiconductor package is an integrated circuit chip implemented in a form suitable for use in electronic products. In a typical semiconductor package, a semiconductor chip may be mounted on a printed circuit board (PCB), and may be electrically connected to the PCB through bonding wires or bumps. Various techniques for improving reliability, providing higher integration, and providing further miniaturization of semiconductor packages have been studied with the development of the electronic industry.

SUMMARY

Aspects of the inventive concept provide semiconductor packages with improved electrical characteristics.

Aspects of the inventive concept provide semiconductor packages with high integration.

The problems to be solved by the inventive concept are not limited to the above-mentioned problems, and other problems not mentioned will be clearly understood by those of ordinary skill in the art from the following description.

A semiconductor package according to some embodiments of the inventive concept may include a first redistribution substrate, a second redistribution substrate on the first redistribution substrate, a chip stack between the first redistribution substrate and the second redistribution substrate, a first molding layer on the chip stack, and a through electrode that extends into the first molding layer and electrically connects the first redistribution substrate to the second redistribution substrate. The chip stack may include a first semiconductor chip on the first redistribution substrate, the first semiconductor chip including a through via that extends therein, a chip structure that includes a second semiconductor chip and a second molding layer, the second semiconductor chip being on the first semiconductor chip and electrically connected to the through via, and a third semiconductor chip between the chip structure and the second redistribution substrate, and a side surface of the first semiconductor chip may be coplanar with a side surface of the chip structure.

A semiconductor package according to some embodiments of the inventive concept may include a first redistribution substrate, a first semiconductor chip on the first redistribution substrate, the first semiconductor chip including a through via that extends therein, a chip structure on the first semiconductor chip, the chip structure including a second semiconductor chip, a third semiconductor chip on the chip structure, a second redistribution substrate on the third semiconductor chip, a connection structure that electrically connects the first redistribution substrate to the second redistribution substrate, a first molding layer on the first semiconductor chip, the chip structure, and the third semiconductor chip. The second redistribution substrate may include an insulating layer and wiring patterns in the insulating layer, and the third semiconductor chip may include a chip pad thereon. At least one of the wiring patterns may extend into the first molding layer and the insulating layer and is electrically connected to the chip pad of the third semiconductor chip.

A semiconductor package according to some embodiments of the inventive concept may include a first redistribution substrate, a second redistribution substrate on the first redistribution substrate, a chip stack between the first redistribution substrate and the second redistribution substrate, a first molding layer on the chip stack, and a through electrode that extends into the first molding layer and electrically connects the first redistribution substrate to the second redistribution substrate. The chip stack may include a first semiconductor chip on the first redistribution substrate, the first semiconductor chip having a through via that extends therein, a second semiconductor chip on the first semiconductor chip, the second semiconductor chip being electrically connected to the through via, a second molding layer between the second semiconductor chip and the first semiconductor chip, and a third semiconductor chip on the second semiconductor chip and the second molding layer, the third semiconductor chip being between the second redistribution substrate and the second semiconductor chip.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1 is a cross-sectional view of a semiconductor package according to some embodiments of the inventive concept.

FIG. 4 is a cross-sectional view of a semiconductor package according to some embodiments of the inventive concept.

FIGS. 5, 6, 7A, 7B, 7C, 7D, 8, 9, 10, 11, 12, 13, 14, and 15 are cross-sectional views illustrating a method of manufacturing a semiconductor package according to some embodiments of the inventive concept.

DETAILED DESCRIPTION

Hereinafter, semiconductor packages according to example embodiments of the inventive concept will be described with reference to the drawings.

Figure 1:
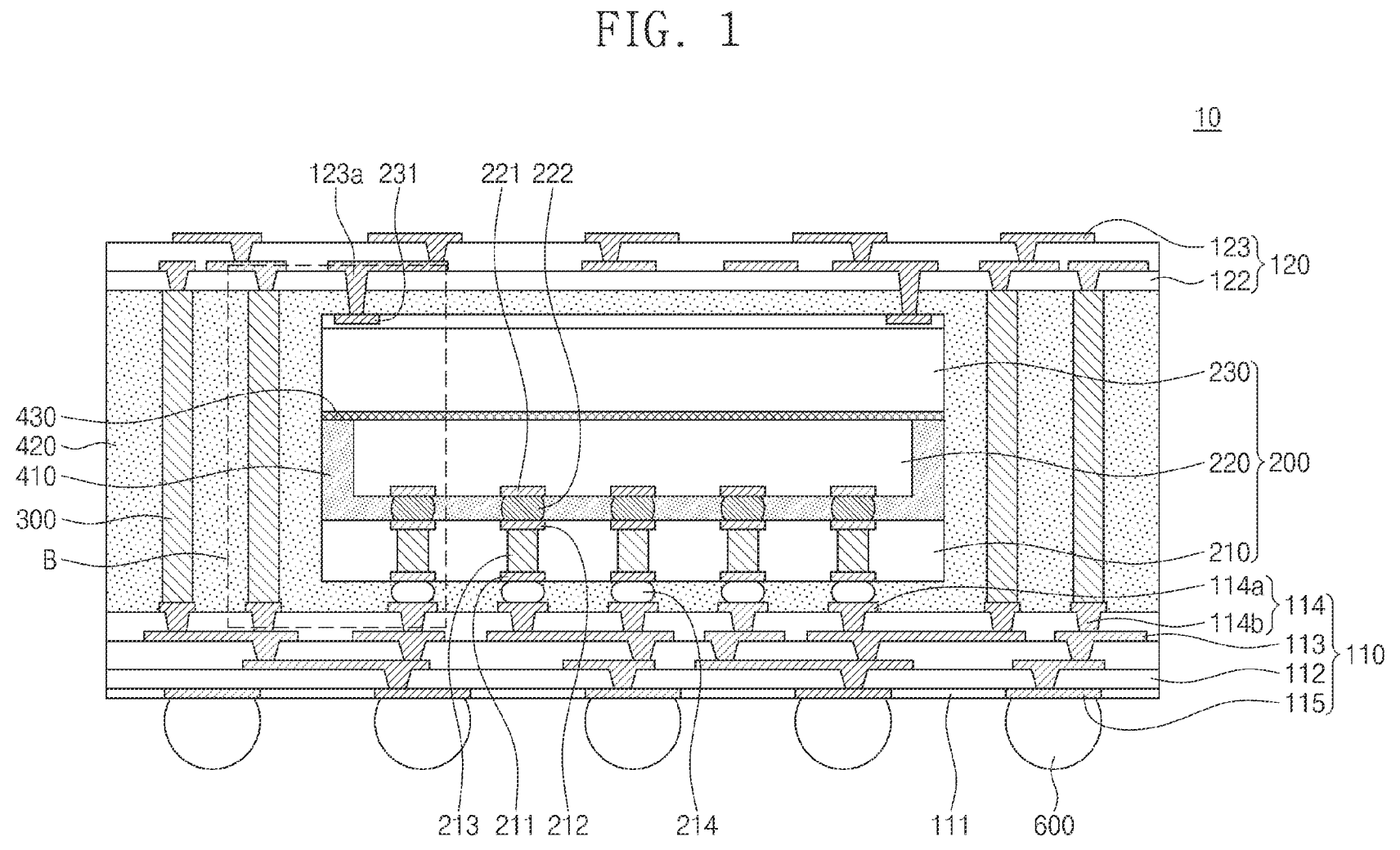
Figure 2:
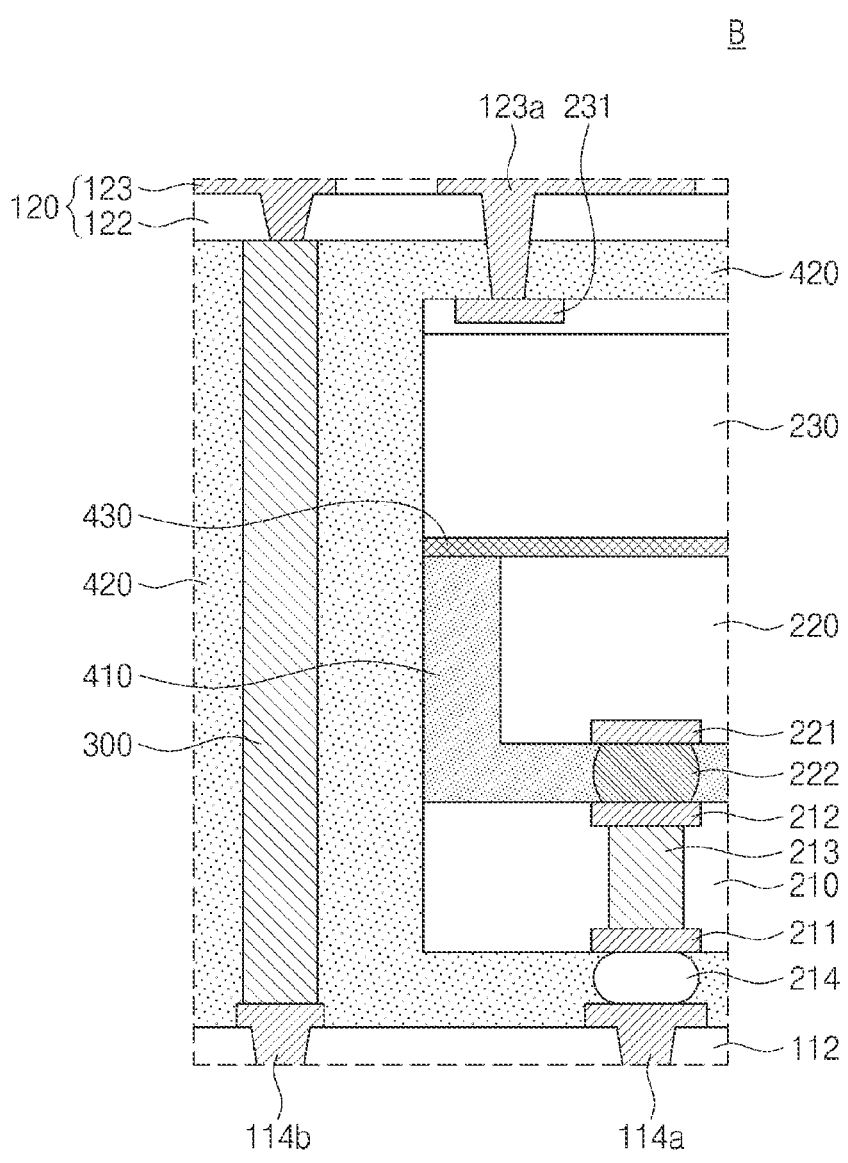
FIG. 2 is an enlarged cross-sectional view of region "B" of FIG. 1 according to some embodiments of the inventive concept.
Figure 3:
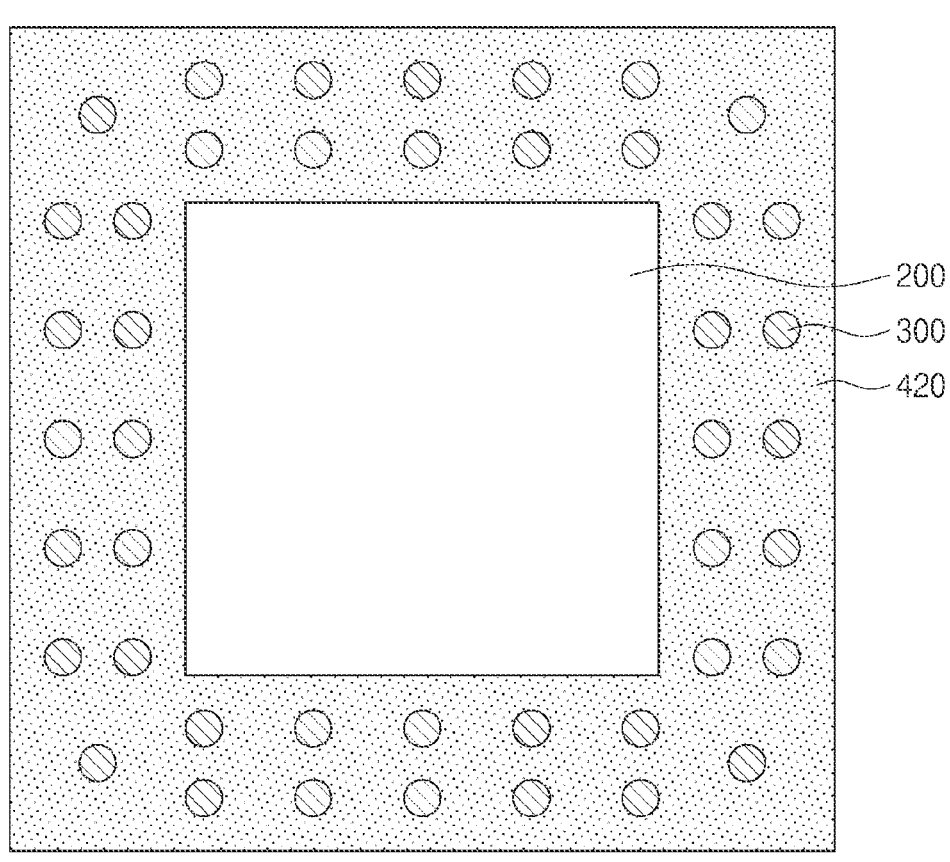
FIG. 3 is a plan view of a semiconductor package according to some embodiments of the inventive concept.

FIG. 1 is a cross-sectional view of a semiconductor package according to some embodiments of the inventive concept. FIG. 2 is an enlarged cross-sectional view of region "B" of FIG. 1 according to some embodiments of the inventive concept. FIG. 3 is a plan view of a semiconductor package according to some embodiments of the inventive concept.

Referring to FIGS. 1 to 3, a semiconductor package 10 may include a first redistribution substrate 110. The first redistribution substrate 110 may have an edge region and a center region in a plan view. The edge region of the first redistribution substrate 110 may be provided between the center region and a side surface of the first redistribution substrate 110. That is, the center region of the first redistribution substrate 110 may be a region on a center of the first redistribution substrate 110, and the edge region of the first redistribution substrate 110 may be a region which surrounds the center region. The first redistribution substrate 110 may include first insulating layers 112 and first wiring patterns 113.

The first insulating layers 112 of the first redistribution substrate 110 may be stacked on each other. The first insulating layers 112 may include, for example, an organic material such as a photo-imageable dielectric (PID) material. The photo-imageable dielectric material may be a polymer. The photo-imageable dielectric material may include, for example, at least one of a photosensitive polyimide, polybenzoxazole, a phenol-based polymer, and/or a benzocyclobutene-based polymer. As used herein, the term "and/or" includes any and all combinations of one or more of the associated listed items. Although an interface between the first insulating layers 112 is indicated in FIG. 1, the inventive concept is not limited thereto. According to other embodiments, the interface between the adjacent first insulating layers 112 may not be distinguished.

The first wiring patterns 113 may be provided in the first insulating layers 112. Each of the first wiring patterns 113 may have a first via portion and a first wiring portion integrally connected to each other. The first wiring portion may be a pattern for horizontal connection in the first redistribution substrate 110. The first via portion may be a portion vertically connecting the first wiring patterns 113 in the first insulating layers 112. The first wiring portion may be provided on the first via portion. The first wiring portion may be connected to the first via portion without an interface. A width of the first wiring portion may be greater than a width of the first via portion. That is, each of the first wiring patterns 113 may have a T-shaped cross section. The first wiring portions of the first wiring patterns 113 may be positioned on upper surfaces of the first insulating layers 112. The first via portions of the first wiring patterns 113 may pass or extend through the first insulating layers 112 and may be connected to the first wiring portions of other first wiring patterns 113 disposed thereunder. The first wiring patterns 113 may include a conductive material. For example, the first wiring patterns 113 may include copper (Cu).

Although not shown, seed patterns may be respectively disposed on lower surfaces of the first wiring patterns 113. For example, the seed patterns may cover or be on a lower surface and a sidewall of the first via portion, and a lower surface of the first wiring portion of the corresponding first wiring patterns 113, respectively. The seed patterns may include a material different from a material of the first wiring patterns 113. For example, the seed patterns may include copper (Cu), titanium (Ti), or an alloy thereof. The seed patterns may function as a barrier layer and may prevent diffusion of a material included in the first wiring patterns 113.

The uppermost first wiring patterns 113 of the first wiring patterns 113 may be first redistribution pads 114 of the first redistribution substrate 110. For example, the portions of the first wiring patterns 113 may be exposed on an upper surface of the first redistribution substrate 110. The first redistribution pads 114 may be laterally spaced apart from each other. The first redistribution pads 114 may be connected to the first wiring patterns 113. The first redistribution pads 114 may protrude or extend from the upper surface of the first redistribution substrate 110. The first redistribution pads 114 may include first redistribution pads 114a for mounting a first semiconductor chip 210 in the center region and first redistribution pads 114b in the edge region. The first redistribution pads 114 may include a conductive material. For example, the first redistribution pads 114 may include copper (Cu).

First substrate pads 115 may be provided under the lowermost first insulating layer 112 among the first insulating layers 112. The first substrate pads 115 may be laterally spaced apart from each other. The first substrate pads 115 may be connected to the first wiring patterns 113. For example, the first via portion of the lowermost first wiring pattern 113 may pass or extend through the first insulating layer 112 to be connected to the first substrate pads 115. The first substrate pads 115 may be connected to the first redistribution pads 114 through the first wiring patterns 113. The first substrate pads 115 and the first redistribution pads 114 may not be vertically aligned. The first substrate pads 115 may include a conductive material. For example, the first substrate pads 115 may include copper (Cu).

A passivation layer 111 may be provided under the lowermost first insulating layer 112 among the first insulating layers 112. The passivation layer 111 may surround the first substrate pads 115 on a lower surface of the lowermost first insulating layer 112. For example, the passivation layer 111 may be on side surfaces of respective ones of the first substrate pads 115. Lower surfaces of the first substrate pads 115 may not be covered or may not be overlapped by the passivation layer 111. The passivation layer 111 may include a solder resist material.

External connection terminals 600 may be disposed on the lower surface of the first redistribution substrate 110. The external connection terminals 600 may be provided on the exposed lower surfaces of the first substrate pads 115. The external connection terminals 600 may be laterally spaced apart from each other. The external connection terminals 600 may be respectively connected to the first substrate pads 115. The external connection terminals 600 may be electrically connected to the first wiring patterns 113 through the first substrate pads 115. The external connection terminals 600 may include a solder material. For example, the external connection terminals 600 may include tin (Sn), bismuth (Bi), lead (Pb), silver (Ag), or an alloy thereof.

A chip stack 200 may be provided on the first redistribution substrate 110. The chip stack 200 may include a first semiconductor chip 210, a chip structure, and a third semiconductor chip 230 that are sequentially stacked on the first redistribution substrate 110. Hereinafter, a configuration of the chip stack 200 will be described in more detail.

The first semiconductor chip 210 may be disposed on the first redistribution substrate 110. The first semiconductor chip 210 may be mounted on the first redistribution substrate 110. The first semiconductor chip 210 may be disposed on an upper surface of the first redistribution substrate 110. The first semiconductor chip 210, for example, may be disposed on the center region of the first redistribution substrate 110 in a plan view. The first semiconductor chip 210 may be disposed face down on the first redistribution substrate 110. For example, the first semiconductor chip 210 may have a front surface facing the first redistribution substrate 110 and a rear surface opposite to the front surface. Hereinafter, in the present specification, the front surface may be one surface on an active surface of an integrated device in a semiconductor chip and may be defined as a surface on which pads of the semiconductor chip are formed, and the rear surface may be a surface opposite to the front surface. Hereinafter, in the present specification, the front surface of the first semiconductor chip 210, the second semiconductor chip 220, and/or the third semiconductor chip 230 may be referred to as an active surface, and the rear surface of the first semiconductor chip 210, the second semiconductor chip 220, and/or the third semiconductor chip 230 may refer to a surface opposite to the active surface (i.e., opposite to the front surface). An upper surface of the first semiconductor chip 210 may correspond to the rear surface, and a lower surface of the first semiconductor chip 210 may correspond to the front surface. For example, the first semiconductor chip 210 may be disposed such that its front surface faces the first redistribution substrate 110. The first semiconductor chip 210 may be, for example, a logic chip or a buffer chip. The logic chip may include an ASIC chip or an application processor (AP) chip. In some embodiments, the logic chip may include a central processing unit (CPU) or a graphics processing unit (GPU). The ASIC chip may include an application specific integrated circuit (ASIC). As another example, the first semiconductor chip 210 may be a memory chip.

The first semiconductor chip 210 may include lower chip pads 211, through vias 213, and upper chip pads 212. The lower chip pads 211 may be provided on the lower surface of the first semiconductor chip 210. The lower chip pads 211 may be directly connected to integrated circuits formed under the first semiconductor chip 210. The upper chip pads 212 may be provided on the upper surface of the first semiconductor chip 210. The lower chip pads 211 or the upper chip pads 212 may be chip pads of the first semiconductor chip 210. The through vias 213 may vertically penetrate or extend into the first semiconductor chip 210 to connect the lower chip pads 211 and the upper chip pads 212. The upper chip pads 212 may be electrically connected to the lower chip pads 211 through the through vias 213. In the present specification, when a component is electrically connected to a semiconductor chip, it may mean electrically connected to integrated circuits through chip pads of the semiconductor chip. An electrical connection of the two components to each other may include a direct connection or an indirect connection through another component. The through vias 213 may include metal. For example, the through vias 213 may include copper (Cu).

The first semiconductor chip 210 may be flip-chip mounted on the first redistribution substrate 110. The first chip connection terminals 214 may be provided on lower surfaces of the lower chip pads 211 of the first semiconductor chip 210. The first chip connection terminals 214 may be interposed between the first semiconductor chip 210 and the first redistribution pads 114a. For example, the first chip connection terminals 214 may be provided between the first semiconductor chip 210 and the first redistribution pads 114a to be connected to the corresponding lower chip pads 211 and the first redistribution pads 114a of the first semiconductor chip 210. Accordingly, the first semiconductor chip 210 may be electrically connected to the first redistribution substrate 110 through the first chip connection terminals 214. The first chip connection terminals 214 may include a conductive material. For example, the first chip connection terminals 214 may include copper (Cu).

A chip structure may be disposed on the first semiconductor chip 210. The chip structure may include a second semiconductor chip 220 and a second molding layer 410.

The second semiconductor chip 220 may be disposed on the first semiconductor chip 210. The second semiconductor chip 220 may be a different type of semiconductor chip from the first semiconductor chip 210. The second semiconductor chip 220 may be, for example, a logic chip or a buffer chip. As another example, the second semiconductor chip 220 may be a memory chip. A width and a planar shape of the second semiconductor chip 220 may be smaller than a width and a planar shape of the first semiconductor chip 210. The second semiconductor chip 220 may vertically overlap at least a portion of the first semiconductor chip 210 in the center region. For example, the entire second semiconductor chip 220 may vertically overlap the first semiconductor chip 210, and the second semiconductor chip 220 may be positioned inside the first semiconductor chip 210 in a plan view. The second semiconductor chip 220 may include first chip pads 221 provided on a lower surface of the second semiconductor chip 220. The second semiconductor chip 220 may include a front surface and a rear surface opposite to each other. The second semiconductor chip 220 may be disposed such that its front surface faces the first redistribution substrate 110.

The second semiconductor chip 220 may be flip-chip mounted on the first semiconductor chip 210. Second chip connection terminals 222 may be provided on lower surfaces of the first chip pads 221 of the second semiconductor chip 220. The second chip connection terminals 222 may be connected to the first chip pads 221 of the second semiconductor chip 220. The second chip connection terminals 222 may be interposed between the first semiconductor chip 210 and the second semiconductor chip 220. The second chip connection terminals 222 may be connected to the upper chip pads 212 of the first semiconductor chip 210. Accordingly, the second semiconductor chip 220 may be electrically connected to the first semiconductor chip 210. The second chip connection terminals 222 may include a conductive material. For example, the second chip connection terminals 222 may include copper (Cu).

The second molding layer 410 may be provided on the first semiconductor chip 210. The second molding layer 410 may surround the second chip connection terminals 222 under the second semiconductor chip 220. The second molding layer 410 may cover or be on side surfaces and a lower surface of the second semiconductor chip 220, except for an upper surface thereof. For example, the second molding layer 410 may not be on an upper surface of the second semiconductor chip 220. For example, the second molding layer 410 may extend from the side surfaces of the second semiconductor chip 220 into a space between the second semiconductor chip 220 and the first semiconductor chip 210. The second molding layer 410 may surround the second chip connection terminals 222 between the first semiconductor chip 210 and the second semiconductor chip 220. For example, the second molding layer 410 may be on side surfaces of respective ones of the second chip connection terminals 222. The second molding layer 410 may be in contact with the upper surface of the first semiconductor chip 210. A side surface of the second molding layer 410 may be coplanar with a side surface of the first semiconductor chip 210. In some embodiments, the second molding layer 410 may not be provided on the side surface of the second semiconductor chip 220, and the second molding layer 410 may be provided only between the second semiconductor chip 220 and the first semiconductor chip 210. In this case, a width and planar shape of the second semiconductor chip 220 may be substantially the same as a width and planar shape of the first semiconductor chip 210, and a side surface of the first semiconductor chip 210 and a side surface of the second semiconductor chip 220 may form a coplanar surface. According to some embodiments of the inventive concept, the first semiconductor chip 210, the second semiconductor chip 220, and the second molding layer 410 may configure a three-dimensional (3D) integrated circuit. The second molding layer 410 may include an insulating polymer such as an epoxy-based molding compound.

The third semiconductor chip 230 may be disposed on the chip structure. For example, the third semiconductor chip 230 may be on the second semiconductor chip 220 and/or the second molding layer 410. The third semiconductor chip 230 may include upper and lower surfaces opposite to each other. The upper surface of the third semiconductor chip 230 may be a front surface served as an active surface. The lower surface of the third semiconductor chip 230 may be a rear surface. The rear surface of the third semiconductor chip 230 may face the second semiconductor chip 220. In other words, the second semiconductor chip 220 and the third semiconductor chip 230 may be disposed in a back-to-back configuration in which rear surfaces of the second semiconductor chip 220 and the third semiconductor chip 230 face each other. The front surface of the third semiconductor chip 230 may face a direction opposite to a direction facing the second semiconductor chip 220. For example, the front surface of the third semiconductor chip 230 may face the second redistribution substrate 120 to be described later. The third semiconductor chip 230 may include second chip pads 231 provided on the upper surface of the third semiconductor chip 230. The second chip pads 231 may be exposed from the upper surface of the third semiconductor chip 230. According to some embodiments of the inventive concept, the third semiconductor chip 230 may be stacked on the upper surface of the first semiconductor chip 210 and the second semiconductor chip 220 constituting the three-dimensional integrated circuit to implement a semiconductor package with improved integration. A side surface of the third semiconductor chip 230 may be aligned with a side surface of the first semiconductor chip 210 and a side surface of the chip structure. However, the inventive concept is not limited thereto. A width and planar shape of the third semiconductor chip 230 may be different from a width and planar shape of the first semiconductor chip 210 and a width and planar shape of the chip structure.

Differently from that shown, the side surfaces of the first semiconductor chip 210, the second semiconductor chip 220, and the third semiconductor chip 230 may be vertically aligned depending on the planar shape of the second semiconductor chip 220. The widths of the first semiconductor chip 210, the second semiconductor chip 220, and the third semiconductor chip 230 may be the same as each other. In some embodiments, the first semiconductor chip 210, the second semiconductor chip 220, and the third semiconductor chip 230 may have different widths and sizes as needed.

A third semiconductor chip 230 may be adhered to chip structure. For example, an adhesive member 430 may be provided on the lower surface of the third semiconductor chip 230. The adhesive member 430 may be interposed between the lower surface of the third semiconductor chip 230 and the upper surface of the chip structure. In more detail, the adhesive member 430 may be provided on the lower surface of the third semiconductor chip 230, and may be adhered to the upper surface of the second semiconductor chip 220 and the upper surface of the second molding layer 410. The lower surface of the third semiconductor chip 230 and the upper surface of the second semiconductor chip 220 may be spaced apart from each other with the adhesive member 430 interposed therebetween. The adhesive member 430 may include an adhesive material. The adhesive member 430 may be an adhesive film. The adhesive member 430 may include epoxy.

The first semiconductor chip 210, the second semiconductor chip 220, and the third semiconductor chip 230 may be sequentially stacked on the first redistribution substrate 110. The first semiconductor chip 210, the second semiconductor chip 220, and the third semiconductor chip 230 may include at least a portion vertically overlapping each other. The overlapping portion may be a region where all of the first semiconductor chip 210, the second semiconductor chip 220, and the third semiconductor chip 230 overlap. As illustrated, the second semiconductor chip 220 and the third semiconductor chip 230 are provided as one semiconductor chip, but the inventive concept is not limited thereto. The second semiconductor chip 220 and the third semiconductor chip 230 may include two or more semiconductor chips spaced apart from each other, as needed.

A first molding layer 420 may be disposed on the first redistribution substrate 110. The first molding layer 420 may surround the chip stack 200 on the first redistribution substrate 110. In more detail, the first molding layer 420 may cover or be on side surfaces of the first semiconductor chip 210, side surfaces of the chip structure, and side surfaces of the third semiconductor chip 230. The first molding layer 420 may at least partially or fully fill a space between the chip stack 200 and the first redistribution substrate 110. For example, the first molding layer 420 may surround the first chip connection terminals 214 between the chip stack 200 and the first redistribution substrate 110. For example, the first molding layer 420 may be on side surfaces of respective ones of the first chip connection terminals 214. In some embodiments, the first molding layer 420 may cover or be on the chip stack 200. For example, the first molding layer 420 may cover or be on the upper surface of the third semiconductor chip 230. Side surfaces of the first molding layer 420 may be vertically aligned with side surfaces of the first redistribution substrate 110. The first molding layer 420 may include an insulating polymer such as an epoxy-based molding compound. The first molding layer 420 may include the same or different material from the second molding layer 410.

Through electrodes 300 may be provided on the first redistribution substrate 110. The through electrodes 300 may be horizontally spaced apart from the chip stack 200 on the first redistribution substrate 110. For example, the through electrodes 300 may be disposed on the edge region of the first redistribution substrate 110. The through electrodes 300 may surround the chip stack 200 in a plan view. The through electrodes 300 may be disposed to be spaced apart from the side surface of the chip stack 200.

The through electrodes 300 may vertically penetrate or extend into the first molding layer 420 to be connected to the first redistribution substrate 110. For example, the through electrodes 300 may be connected to the first redistribution pads 114b of the first redistribution substrate 110. The through electrodes 300 may be electrically connected to the external connection terminals 600, the first semiconductor chip 210, and the second semiconductor chip 220 through the first redistribution substrate 110.

The through electrodes 300 may be provided in plurality, and may be spaced apart from each other on the first redistribution substrate 110. In a plan view, the through electrodes 300 may be arranged to surround the first semi-conductor chip 210, the second semiconductor chip 220, and the third semiconductor chip 230. The through electrodes 300 may be a connection structure connecting the first redistribution substrate 110 and the second redistribution substrate 120 to be described later. Upper surfaces of the through electrodes 300 may be exposed as the upper surface of the first molding layer 420. A level of the upper surface of each of the through electrodes 300 may be equal to or higher than a level of the upper surface of the third semi-conductor chip 230. Each of the through electrodes 300 may have a cylindrical shape. However, the shape of the through electrodes 300 may be variously modified, and may be a polygonal column shape. A width of the through electrodes 300 may be uniform regardless of a distance from the first redistribution substrate 110. In some embodiments, a width of the through electrodes 300 may become narrower toward the first redistribution substrate 110. The through electrodes 300 may include a metal material. For example, the through electrodes 300 may include copper (Cu) or tungsten (W).

As the through electrodes 300 are provided in plurality, a heat transfer path may be diversified, and heat transfer efficiency in a vertical direction by the through electrodes 300 may be further improved. Differently from that illus-trated in the drawings, the through electrodes 300 may be a plurality of walls extending along the side surfaces of the chip stack 200.

A second redistribution substrate 120 may be provided on the first molding layer 420 and the through electrodes 300. The second redistribution substrate 120 may cover or be on the upper surface of the first molding layer 420 and the upper surfaces of the through electrodes 300. The second redistri-bution substrate 120 may include second insulating layers 122 and second wiring patterns 123.

The second redistribution substrate 120 may include the stacked second insulating layers 122. The second insulating layers 122 may be stacked on the first molding layer 420. Each of the second insulating layers 122 may include the same material. The second insulating layers 122 may include, for example, an organic material such as a photo-imageable dielectric (PID) material. The photo-imageable dielectric material may be a polymer. The photo-imageable dielectric material may include, for example, at least one of a photosensitive polyimide, polybenzoxazole, a phenol-based polymer, and/or a benzocyclobutene-based polymer. An interface between the second insulating layers 122 may not be distinguished, and the number of stacked second insulating layers 122 may be variously modified.

The second wiring patterns 123 may be provided in the second insulating layers 122. Each of the second wiring patterns 123 may have a second via portion and a second wiring portion integrally connected to each other. The sec-ond wiring portion may be a pattern for horizontal connec-tion in the second redistribution substrate 120. The second via portion may be a portion that vertically connects the second wiring patterns 123 in the second insulating layers 122. The second wiring portion may be provided on the second via portion. The second wiring portion may be connected to the second via portion without an interface. A width of the wiring portion may be greater than a width of the second via portion. That is, each of the second wiring patterns 123 may have a T-shaped cross-section. Upper surfaces of the second wiring patterns 123, that is, upper surfaces of the second wiring portions may be located on upper surfaces of the second insulating layers 122. Lower surfaces of the second wiring patterns 123, that is, lower surfaces of the second via portions may pass or extend through the second insulating layers 122 to be connected to the second wiring portions of other second wiring patterns 123 disposed thereunder. The second wiring patterns 123 may include a conductive material. For example, the second wiring patterns 123 may include copper (Cu).

The lowermost second wiring patterns 123 among the second wiring patterns 123 may be in contact with the upper surfaces of the through electrodes 300. Some of the second wiring patterns 123a among the second wiring patterns 123 may protrude or extend below the lower surface of the second redistribution substrate 120. Some of the second wiring patterns 123a among the second wiring patterns 123 may extend toward the third semiconductor chip 230. For example, the second via portion of some of the second wiring patterns 123a may penetrate or extend into the lowermost second insulating layer 122 and the lowermost first molding layer 420 to be connected to the second chip pads 231 of the third semiconductor chip 230. Accordingly, the third semiconductor chip 230 may be electrically con-nected to the second redistribution substrate 120 through the second wiring patterns 123a. Also, the second redistribution substrate 120 may be electrically connected to the first redistribution substrate 110 through the through electrodes 300. According to some embodiments of the inventive concept, the third semiconductor chip 230 may be directly connected to the second wiring patterns 123 of the second redistribution substrate 120 to constitute a circuit, thereby implementing a semiconductor package in which electrical signals are easily transmitted. Accordingly, a semiconductor package having improved electrical characteristics may be provided.

Although not shown, seed patterns may be respectively disposed on lower surfaces of the second wiring patterns 123. For example, the seed patterns may cover or be on a lower surface and a sidewall of the second via portion, and a lower surface of the second wiring portion of the corre-sponding second wiring patterns 123, respectively. The seed patterns may include a material different from a material of the second wiring patterns 123. For example, the seed patterns may include copper (Cu), titanium (Ti), or an alloy thereof. The seed patterns may function as a barrier layer and may prevent diffusion of a material included in the second wiring patterns 123.

Figure 4:
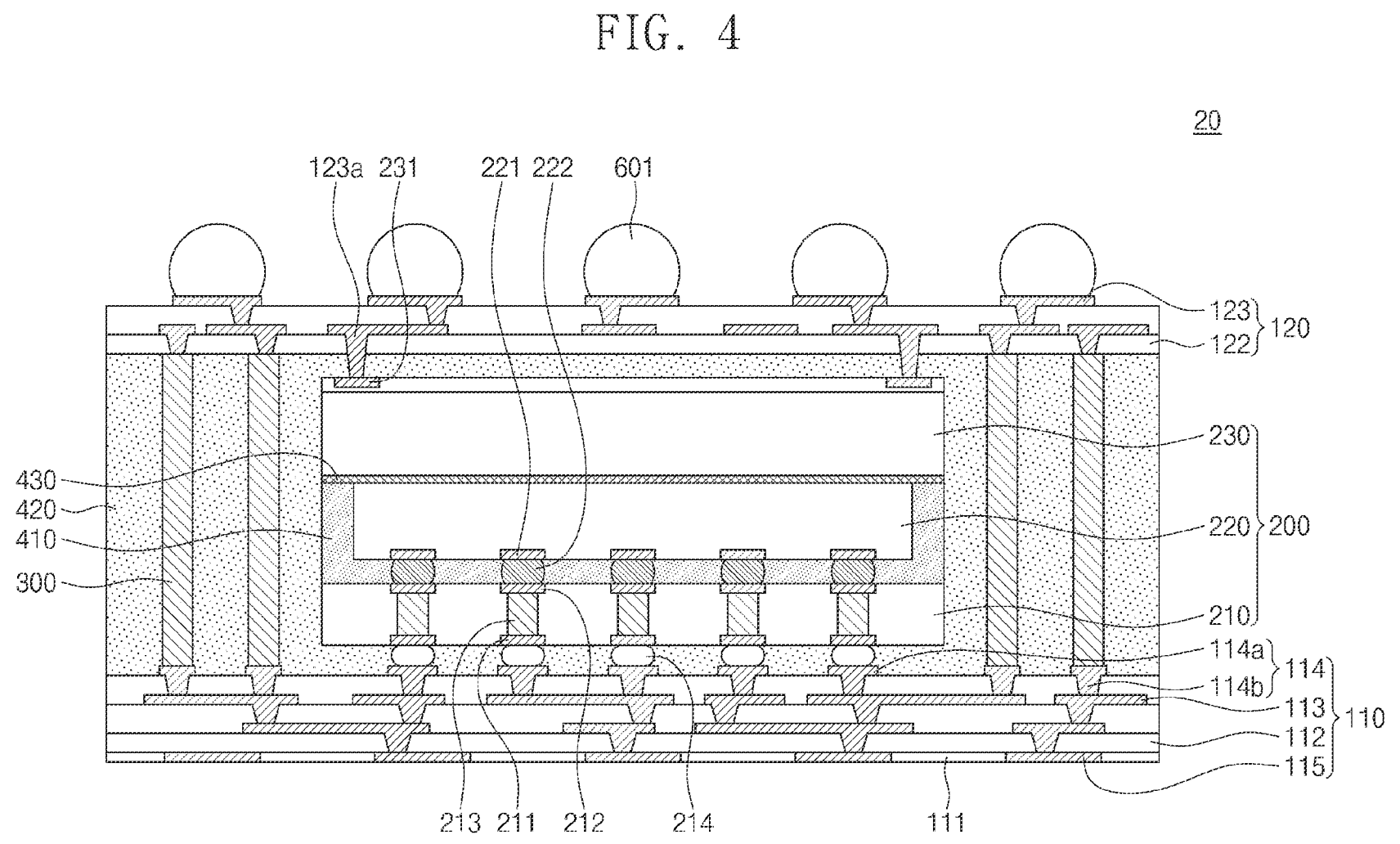

FIG. 4 is a cross-sectional view of a semiconductor package according to some embodiments of the inventive concept. Hereinafter, a content overlapping with the previ-ously described content will be omitted, and the same reference numerals will be used to refer to the same con-figuration as that described with reference to FIG. 1 for convenience of description.

FIGS. 1 to 3 illustrate that external connection terminals 600 are provided on the first redistribution substrate 110. That is, the lower surface of the first redistribution substrate 110 may correspond to a mounting surface of the semicon-ductor package 10. However, the inventive concept is not limited thereto.

Referring to FIG. 4, the external connection terminals 600 may be provided on the second redistribution substrate 120 instead of the first redistribution substrate 110. That is, the upper surface of the second redistribution substrate 120 may correspond to a mounting surface of a semiconductor pack-age 20.

The semiconductor package 20 may have the same or similar configuration to the semiconductor package 10 described with reference to FIG. 1. For example, the semi-conductor package 20 may include the first redistribution substrate 110, the second redistribution substrate 120, the first semiconductor chip 210, the second semiconductor chip 220, the third semiconductor chip 230, the second molding layer 410, the first molding layer 420, the first redistribution pads 114, the lower chip pads 211, the upper chip pads 212, the through vias 213, the first chip connection terminals 214, the second chip connection terminals 222, the first chip pads 221, and the second chip pads 231.

The first substrate pads 115 may be exposed on the lower surface of the first redistribution substrate 110. External connection terminals 601 may be disposed on the upper surface of the second redistribution substrate 120. The external connection terminals 601 may be provided on the upper surface of the second wiring portion of the second wiring patterns 123 exposed on the upper surface of the second redistribution substrate 120. The external connection terminals 601 may be laterally spaced apart from each other. The external connection terminals 601 may be connected to each of the corresponding second wiring patterns 123. The external connection terminals 601 may be electrically connected to the third semiconductor chip 230 through the second wiring patterns 123. The external connection terminals 601 may be electrically connected to the through electrodes 300 through the second wiring patterns 123. The first semiconductor chip 210, the second semiconductor chip 220, and the third semiconductor chip 230 may be electrically connected to the outside (e.g., electrically connected to a source external to the semiconductor package 20) through the external connection terminals 601 provided on the semiconductor package 20. The external connection terminals 601 may include a solder material. For example, the external connection terminals 601 may include tin (Sn), bismuth (Bi), lead (Pb), silver (Ag), or an alloy thereof.

In the semiconductor package 20 according to some embodiments of the inventive concept, when the first semiconductor chip 210 is vulnerable to heat, the external connection terminals 601 may be disposed on the semiconductor package 20 to protect the first semiconductor chip 210. In more detail, the mounting surface of the semiconductor package 20 may be one surface of the second redistribution substrate 120, and heat generated in the first semiconductor chip 210 may be emitted to the outside (e.g., emitted externally to the semiconductor package 20) through the first redistribution substrate 110. Accordingly, the semiconductor package having improved thermal stability may be provided.

FIGS. 5 to 15 are cross-sectional views illustrating a method of manufacturing a semiconductor package according to some embodiments of the inventive concept. Hereinafter, the contents overlapping with the above-described contents will be omitted, and the same components will be described using the same reference numerals.

Figure 5:
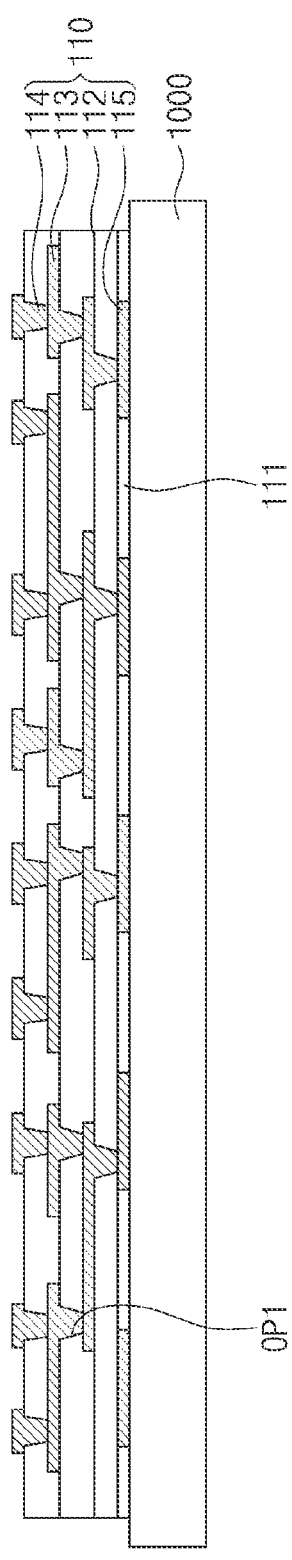

Referring to FIG. 5, a first carrier substrate 1000 may be provided. The first carrier substrate 1000 may be an insulating substrate including glass or a polymer, or a conductive substrate including a metal. Although not shown, an adhesive member may be provided on an upper surface of the first carrier substrate 1000. For example, the adhesive member may include an adhesive tape.

First substrate pads 115 may be formed on the first carrier substrate 1000. The first substrate pads 115 may be formed by an electroplating process. For example, the passivation layer 111 may be formed on the first carrier substrate 1000, and then openings defining regions in which the first substrate pads 115 are formed may be formed in the passivation layer 111. Thereafter, the electroplating process may be performed such that a conductive material at least partially or fully fills the openings. The passivation layer 111 may surround the first substrate pads 115. For example, the passivation layer 111 may be on side surfaces of respective ones of the first substrate pads 115. The passivation layer 111 may expose the first substrate pads 115.

A first insulating layer 112 may be formed on the passivation layer 111. For example, the first insulating layer 112 may be formed by applying an insulating material on the passivation layer 111. The insulating material may include, for example, an organic material such as a photo-imageable dielectric (PID) material. The photo-imageable dielectric material may be a polymer. The photo-imageable dielectric material may include, for example, at least one of a photo-sensitive polyimide, polybenzoxazole, a phenol-based polymer, and/or a benzocyclobutene-based polymer. A first opening OP1 exposing the first substrate pads 115 may be formed by patterning the first insulating layer 112.

After forming a conductive layer on the first insulating layer 112, first wiring patterns 113 may be formed by patterning the conductive layer. The conductive layer may cover, overlap, or be on an upper surface of the first insulating layer 112 and may at least partially or fully fill the first opening OP1.

Although not shown, before the first wiring patterns 113 are formed, the seed patterns may be conformally formed on the upper surface of the first insulating layer 112 and in the first opening OP1. An electroplating process using the seed patterns as electrodes may be performed to form first wiring patterns 113. The first wiring patterns 113 may be formed on the upper surface of the first insulating layer 112 and in the first opening OP1 to cover, overlap, or be on the seed patterns. Each of the first wiring patterns 113 may include a first via portion and a first wiring portion. The first via portion may be formed in a corresponding first opening OP1. The first wiring portion may be formed on the first via portion and may extend onto the upper surface of the first insulating layer 112.

A process of forming the first insulating layer 112, forming the seed patterns, and forming the first wiring patterns 113 may be repeatedly performed. Accordingly, the stacked first insulating layer 112 and the stacked first wiring patterns 113 may be formed. First redistribution pads 114 may be formed in the first opening OP1 of the first insulating layer 112 to be connected to the first wiring patterns 113. The seed patterns may be formed before the first redistribution pads 114 are formed. An electroplating process using the seed patterns as electrodes may be performed to form first redistribution pads 114. Accordingly, the first redistribution substrate 110 may be formed. The first redistribution substrate 110 may include the first insulating layer 112, the first wiring patterns 113, the first substrate pads 115, and the first redistribution pads 114.

Figure 6:
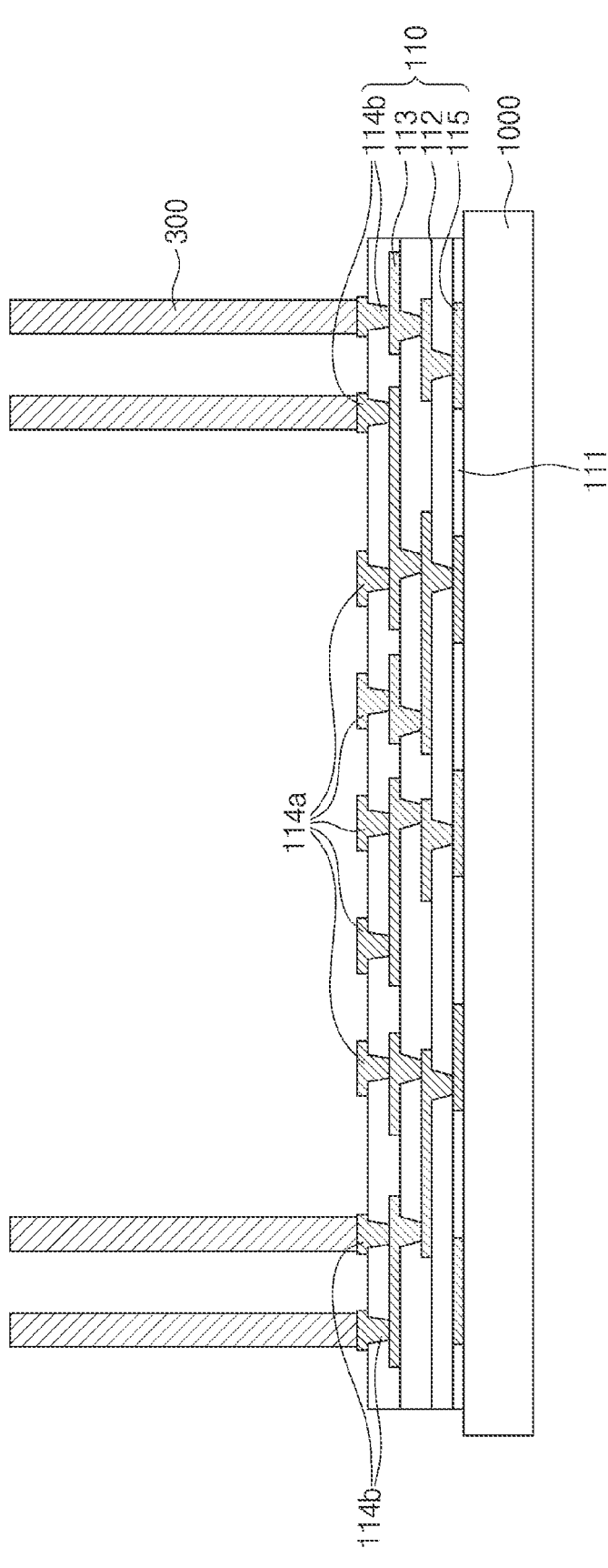

Referring to FIG. 6, through electrodes 300 may be formed on the first redistribution pads 114b. The through electrodes 300 may be formed on the first redistribution pads 114b disposed in the edge region of the first redistribution substrate 110. For example, a sacrificial layer may be formed on the first redistribution substrate 110, a through hole exposing the first redistribution pads 114b may be formed in the sacrificial layer, and an electroplating process may be performed to at least partially or fully fill the through hole with a conductive material. The through electrodes 300 may not be formed on the first redistribution pads 114a of the center region of the first redistribution substrate 110. The through electrodes 300 may be formed to extend from upper surfaces of the first redistribution pads 114b in a direction perpendicular to the first redistribution substrate 110. Each of the through electrodes 300 may be formed in a cylindrical shape. However, the shape of the through electrodes 300 may be variously modified, and may be formed in a polygonal column shape.

Figure 7A:
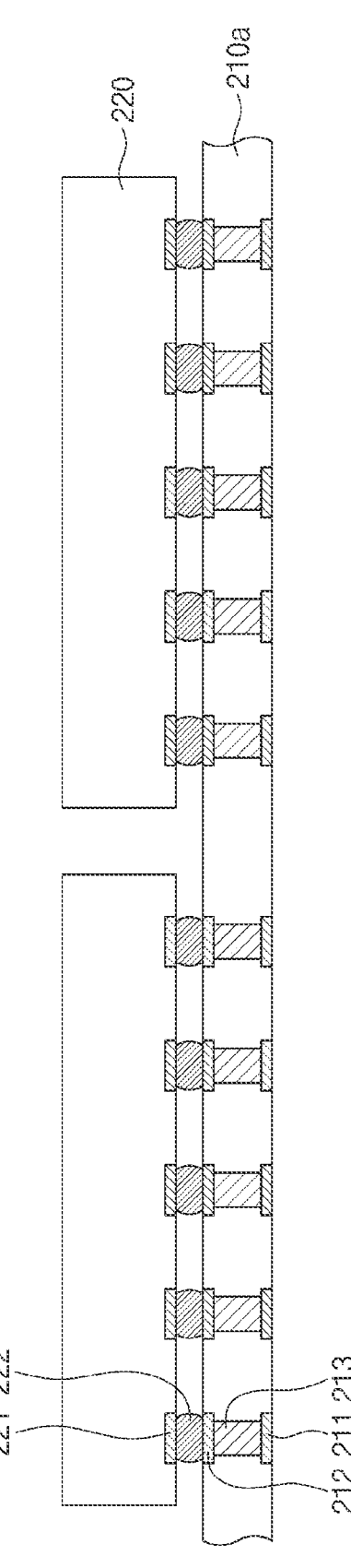

Referring to FIG. 7A, a wafer 210a may be provided to prepare a preliminary package "P" to be described later. The wafer 210a may include lower chip pads 211, upper chip pads 212, and through vias 213. Second chip connection terminals 222 may be disposed on an upper surface of the wafer 210a to correspond to the upper chip pads 212. Second semiconductor chips 220 may be mounted on the wafer 210a. The second semiconductor chips 220 may be disposed such that the first chip pads 221 of the second semiconductor chips 220 correspond to the second chip connection terminals 222.

Figure 7B:
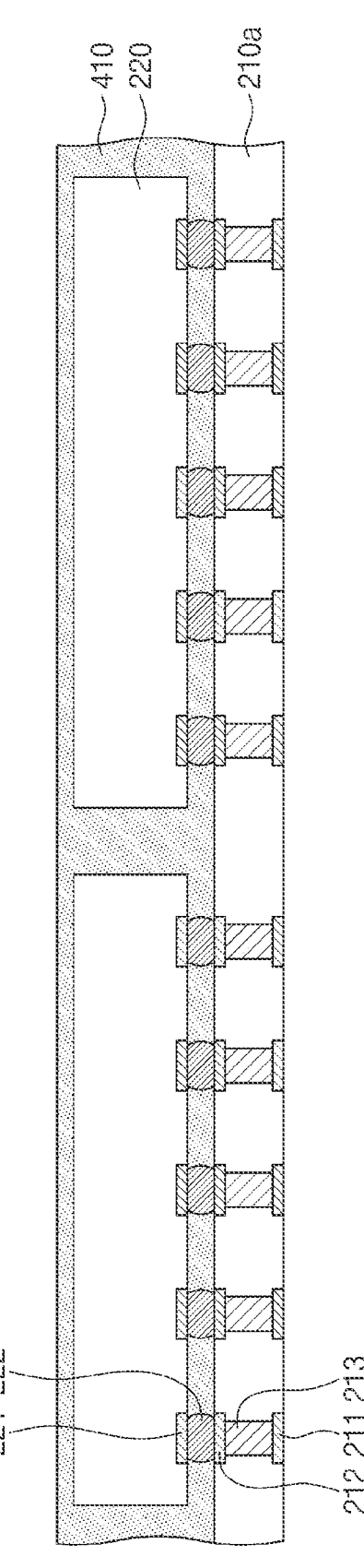

Referring to FIG. 7B, a second molding layer 410 may be formed on the upper surface of the wafer 210a and an upper surface, a lower surface, and side surfaces of each of the second semiconductor chips 220. The second molding layer 410 may cover or be on sidewalls of the second chip connection terminals 222 between the upper surface of the wafer 210a and lower surfaces of the second semiconductor chips 220

Figure 7C:
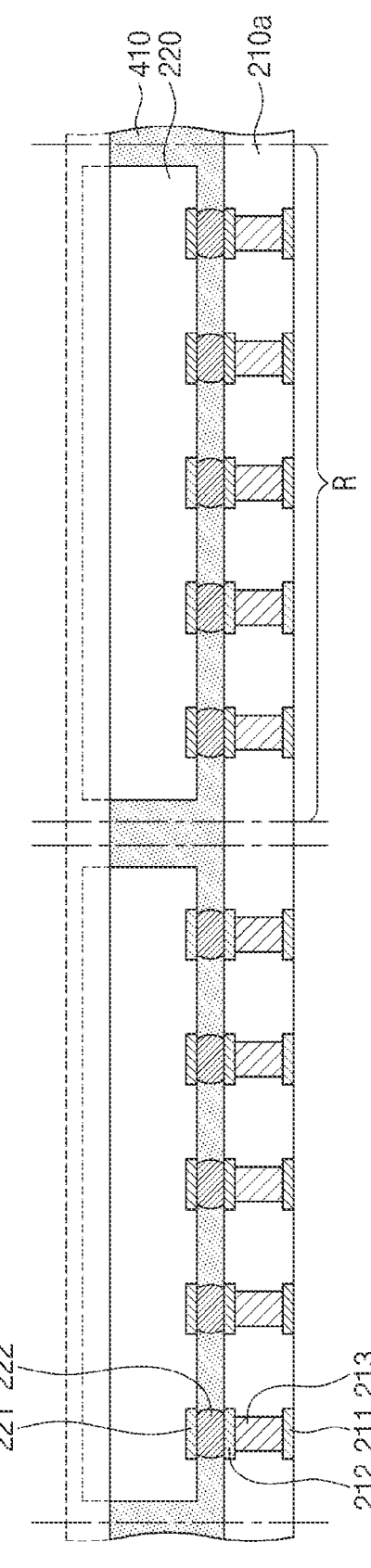
Figure 7D:
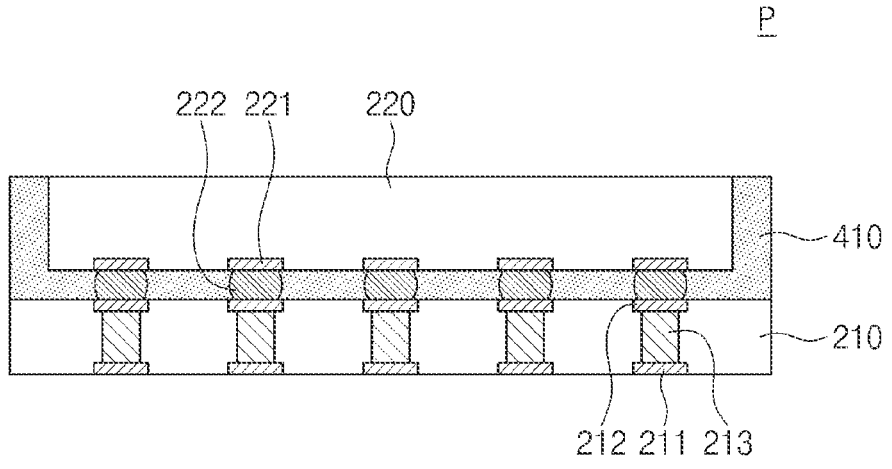

Referring to FIGS. 7C and 7D, a grinding process of the second molding layer 410 may be performed. A portion of the second molding layer 410 may be removed through the grinding process. Upper surfaces of the second semiconductor chips 220 may be exposed through the grinding process. If necessary, an upper portion of the second semiconductor chip 220 may be removed together with the second molding layer 410.

A process of cutting the wafer 210a to form the preliminary package "P" may be performed. Through the cutting process, a partial region "R" of the wafer 210a may become the first semiconductor chip 210. That is, the preliminary packages "P" formed on the wafer 210a may be separated from each other through the cutting process. Through the cutting process, a side surface of the first semiconductor chip 210 and a side surface of the second molding layer 410 may be vertically aligned. In some embodiments, the wafer 210a may be cut to fit a width of the second semiconductor chip 220, and in this case, the second molding layer 410 formed on the side surface of the second semiconductor chip 220 may be removed in the cutting process. Accordingly, the side surface of the first semiconductor chip 210 and the side surface of the second semiconductor chip 220 may be vertically aligned.

Figure 8:
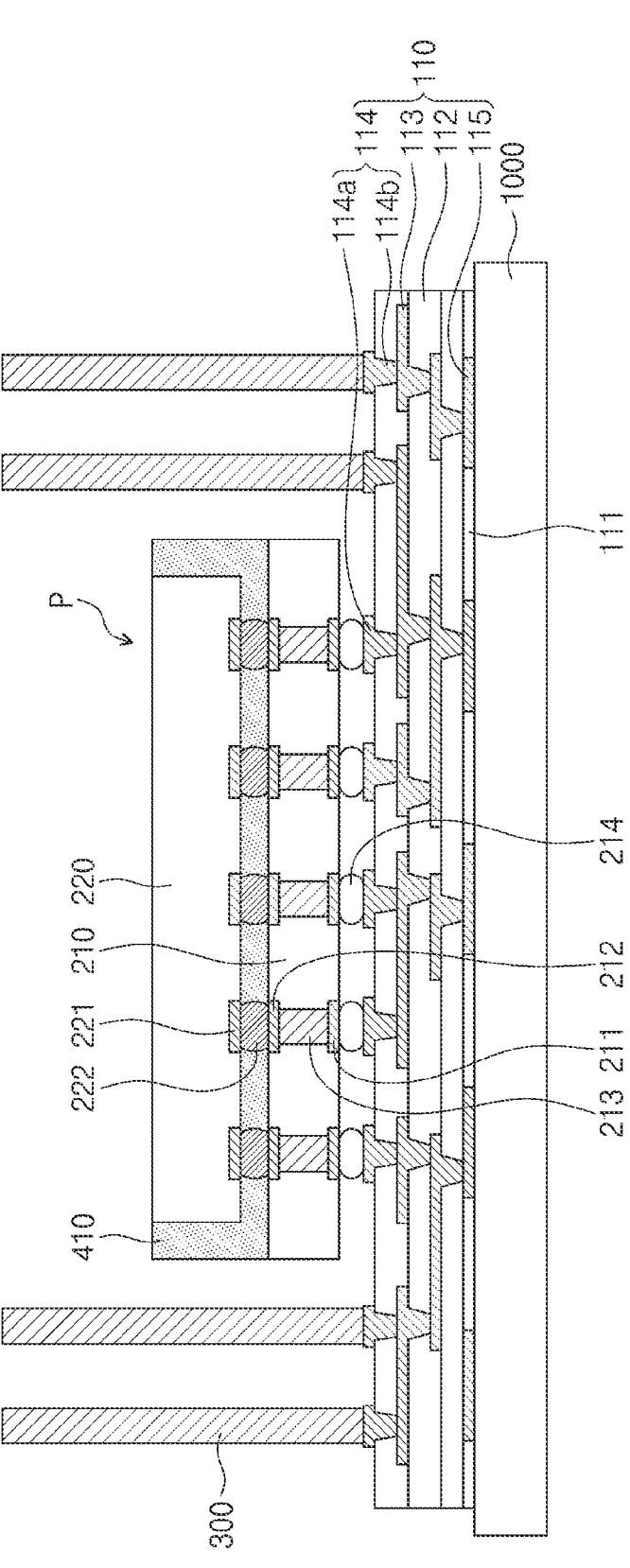

Referring to FIG. 8, the preliminary package "P" may be mounted on the upper surface of the first redistribution substrate 110. For example, the preliminary package "P" may be disposed on the first redistribution substrate 110 such that the lower chip pads 211 face the first redistribution substrate 110. The preliminary package "P" may be disposed between the through electrodes 300. The preliminary package "P" may be surrounded by the through electrodes 300 (e.g., surrounded in a plan view). When the preliminary package "P" is mounted on the first redistribution substrate 110, first chip connection terminals 214 may be formed between the corresponding lower chip pads 211 and the first redistribution pads 114b. Accordingly, the first semiconductor chip 210, the second semiconductor chip 220, and the through electrode 300 may be electrically connected to the first redistribution substrate 110.

Figure 9:
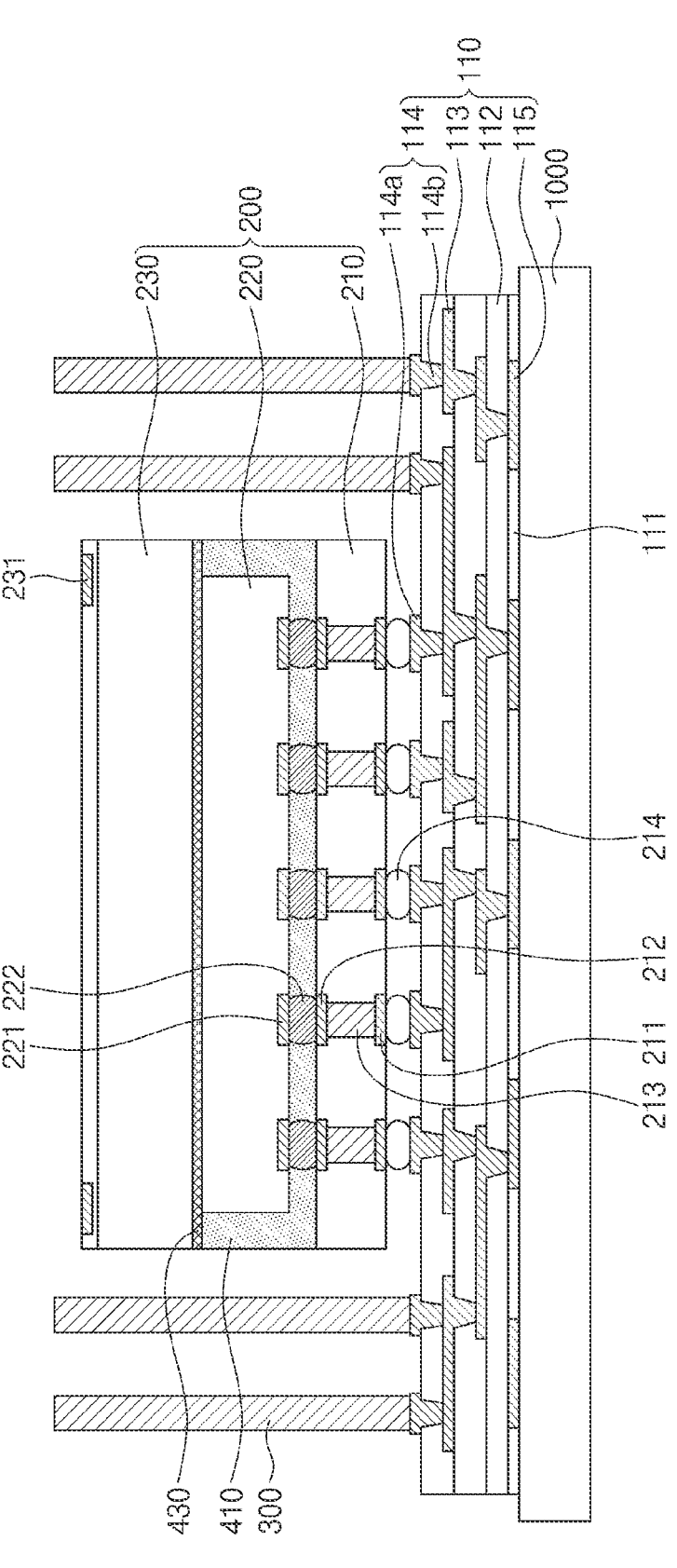

Referring to FIG. 9, a third semiconductor chip 230 may be disposed on the second semiconductor chip 220. The third semiconductor chip 230 may include an active surface including second chip pads 231 and a rear surface opposite to the active surface. The third semiconductor chip 230 may be disposed such that the rear surface thereof faces the second semiconductor chip 220. The rear surface of the third semiconductor chip 230 may be a lower surface of the third semiconductor chip 230. An adhesive member 430 may be provided on the lower surface of the third semiconductor chip 230. The adhesive member 430 may be an adhesive for attaching the lower surface of the third semiconductor chip 230 and the upper surface of the second semiconductor chip 220. A lower surface of the adhesive member 430 may be in contact with the upper surface of the second semiconductor chip 220. Accordingly, the lower surface of the third semiconductor chip may be spaced apart from the upper surface of the second semiconductor chip 220 with the adhesive member 430 interposed therebetween. The lower surface of the third semiconductor chip 230 may be attached to the upper surface of the second semiconductor chip 220 through the adhesive member 430, but may not be in direct contact with each other.

Figure 10:
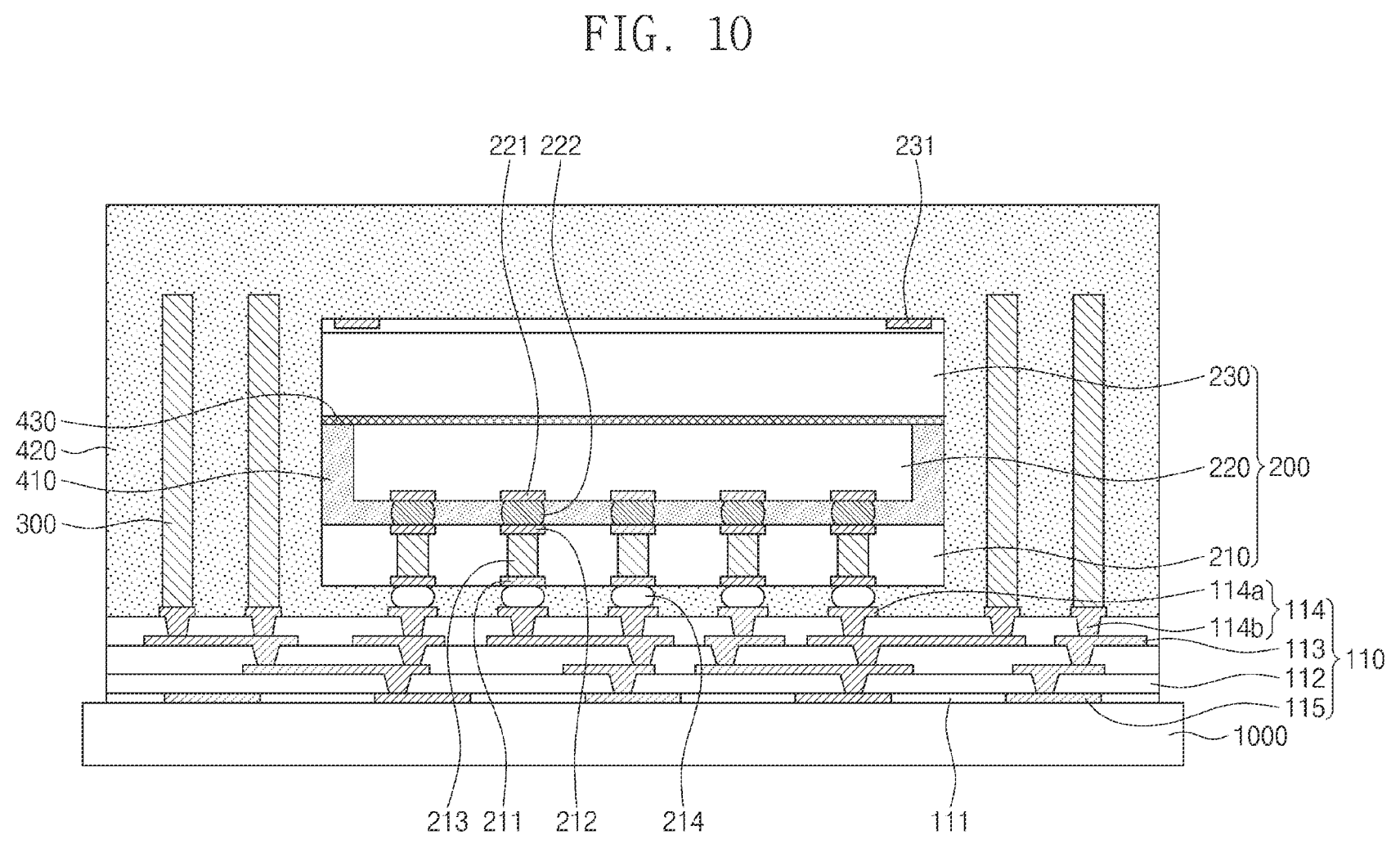

Referring to FIG. 10, a first molding layer 420 may be formed on the upper surface of the first redistribution substrate 110 to cover or be on the first chip connection terminals 214, the first redistribution pads 114, the through electrodes 300, the first semiconductor chip 210, the second semiconductor chip 220, the second molding layer 410, and the third semiconductor chip 230. For example, an insulating material may be applied to cover or be on the first chip connection terminals 214, the first redistribution pads 114, the through electrodes 300, the first semiconductor chip 210, the second semiconductor chip 220, the second molding layer 410, and the third semiconductor chip 230. An upper surface of the first molding layer 420 may be formed at a level higher than a level of the upper surface of the third semiconductor chip 230 and the upper surface of the through electrodes 300.

Figure 11:
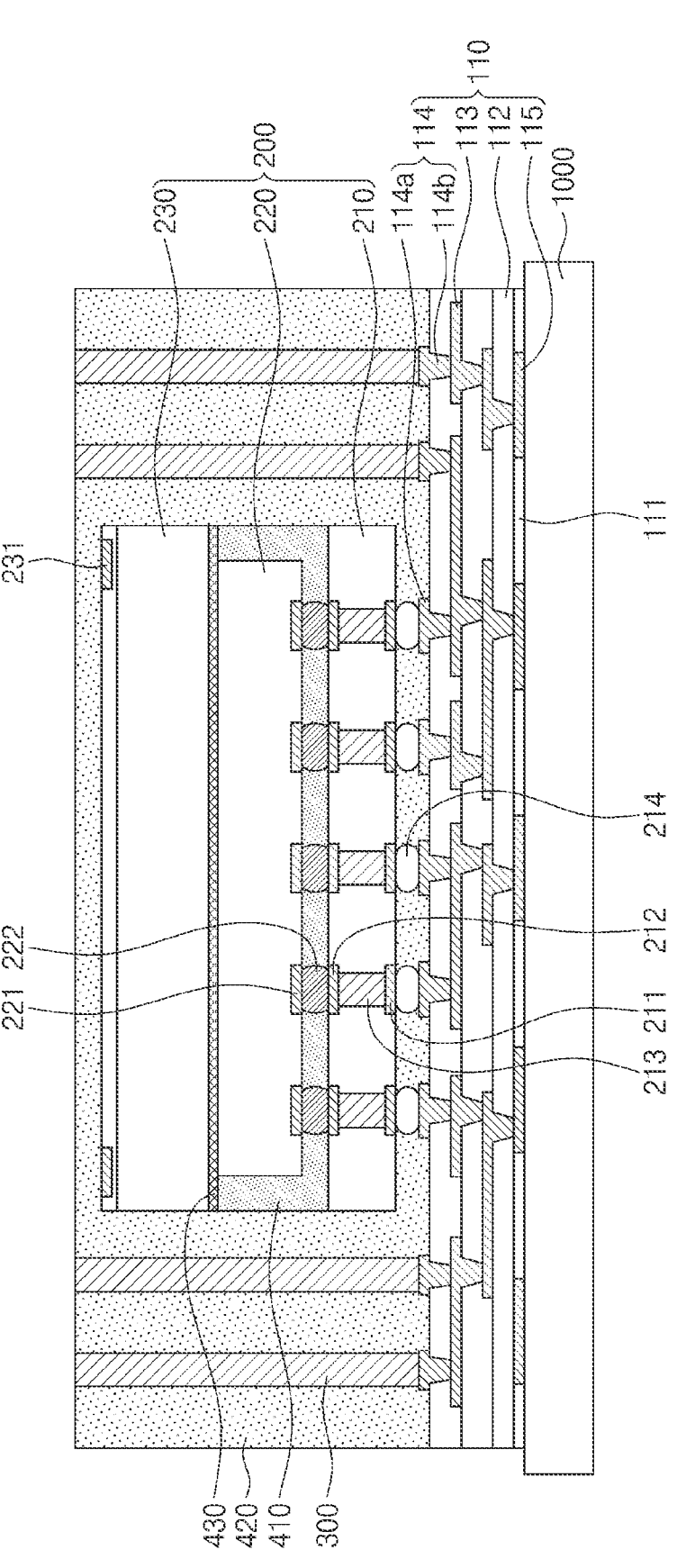

Referring to FIG. 11, a grinding process of the first molding layer 420 may be performed. A portion of the first molding layer 420 may be removed through the grinding process. Upper surfaces of the through electrodes 300 may be exposed by the grinding process of the first molding layer 420. If necessary, upper portions of the through electrodes 300 may be removed together. For example, the grinding process may be performed by a chemical mechanical polishing process (CMP). After the grinding process is completed, the exposed upper surfaces of the through electrodes 300 may be provided at substantially the same level as the upper surface of the first molding layer 420. A level of the upper surface of the third semiconductor chip 230 may be lower than a level of the upper surface of the first molding layer 420. The upper surface of the third semiconductor chip 230 may be covered or overlapped by the first molding layer 420.

Figure 12:
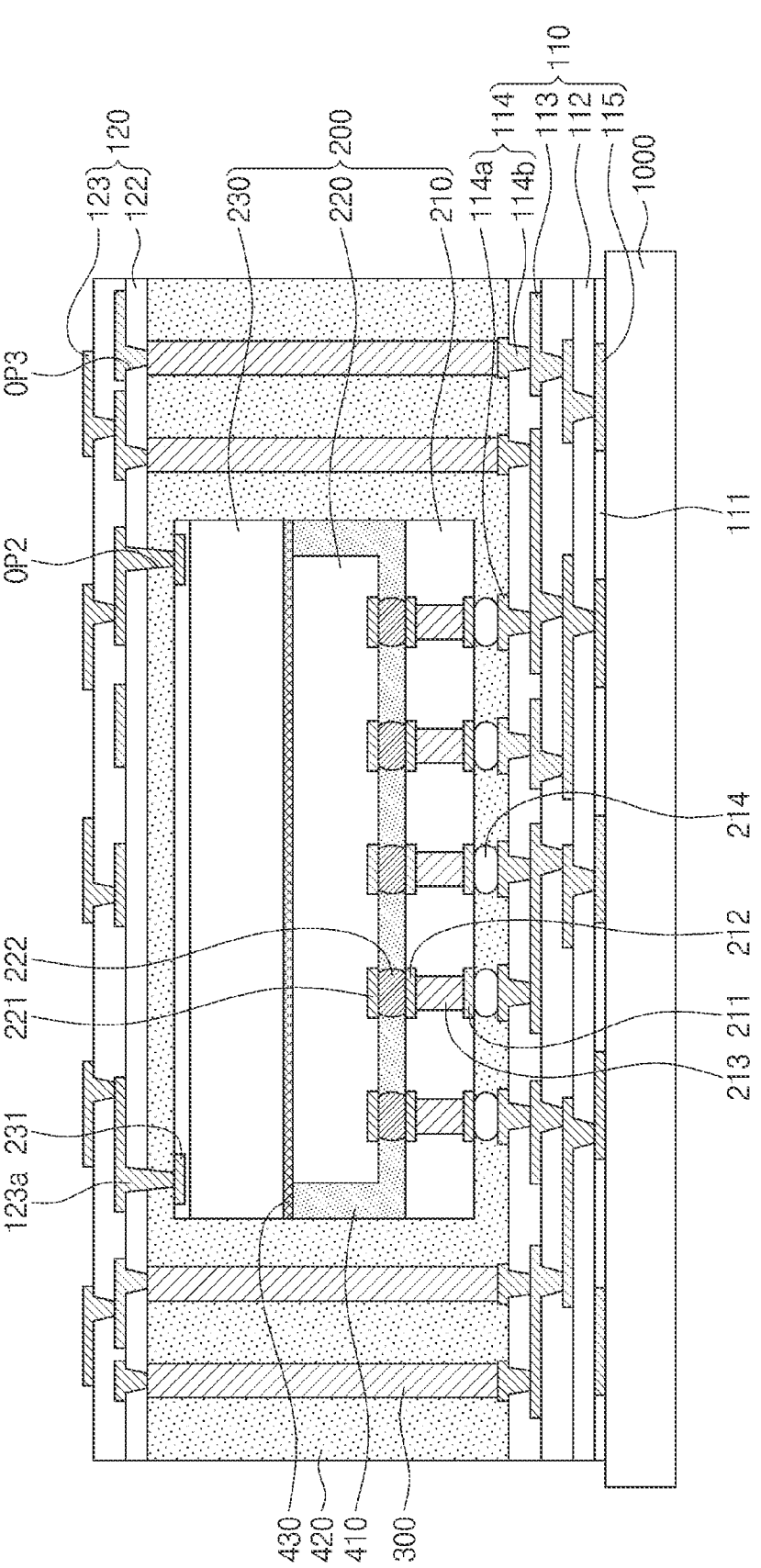

Referring to FIG. 12, a second opening OP2 may be formed on the upper surface of the first molding layer 420. The second opening OP2 may expose a portion of the third semiconductor chip 230. The second opening OP2 may expose upper surfaces of the second chip pads 231.

A second redistribution substrate 120 may be formed on the first molding layer 420. A second insulating layer 122 may be formed on the upper surface of the first molding layer 420. A third opening OP3 may be formed in the second insulating layer 122, and the third opening OP3 may expose the upper surfaces of the through electrodes 300, respectively.

The second insulating layer 122 may include, for example, an organic material such as a photo-imageable dielectric (PID) material. The photo-imageable dielectric material may be a polymer. The photo-imageable dielectric material may include, for example, at least one of a photo-sensitive polyimide, polybenzoxazole, a phenol-based polymer, and/or a benzocyclobutene-based polymer.

Although not shown, seed patterns may be formed before second wiring patterns 123 are formed. The seed patterns may be conformally formed on an upper surface of the second insulating layer 122, and in the second opening OP2 and the third opening OP3. The second wiring patterns 123 may be formed on the upper surface of the second insulating layer 122, and in the second opening OP2 and the third opening OP3 to cover or be on the seed patterns. The second wiring patterns 123 formed in the second opening OP2 may be second wiring patterns 123*a* described with reference to FIG. 1. Each of the second wiring patterns 123 may include the second via portion and the second wiring portion. The second via portion may be formed in the corresponding second opening OP2 and the third opening OP3. The second wiring portion may be formed on the second via portion and may extend on the upper surface of the second insulating layer 122. The second via portion formed in the second opening OP2 may extend toward the third semiconductor chip 230. The second via portion formed in the second opening OP2 may be electrically connected to the third semiconductor chip 230. A method of forming the seed patterns and the second wiring patterns 123 may be the same as or similar to that described in an example in which the seed patterns and the first wiring patterns 113 are formed in FIG. 5. The process of forming the second insulating layer 122, the process of forming the seed patterns, and the process of forming the second wiring patterns 123 may be repeatedly performed. Accordingly, a plurality of stacked second insulating layers 122 and a plurality of stacked second wiring patterns 123 may be formed. The second wiring portions of the uppermost second wiring patterns 123 of the second wiring patterns 123 may be exposed on the upper surface of the second insulating layer 122.

Figure 13:
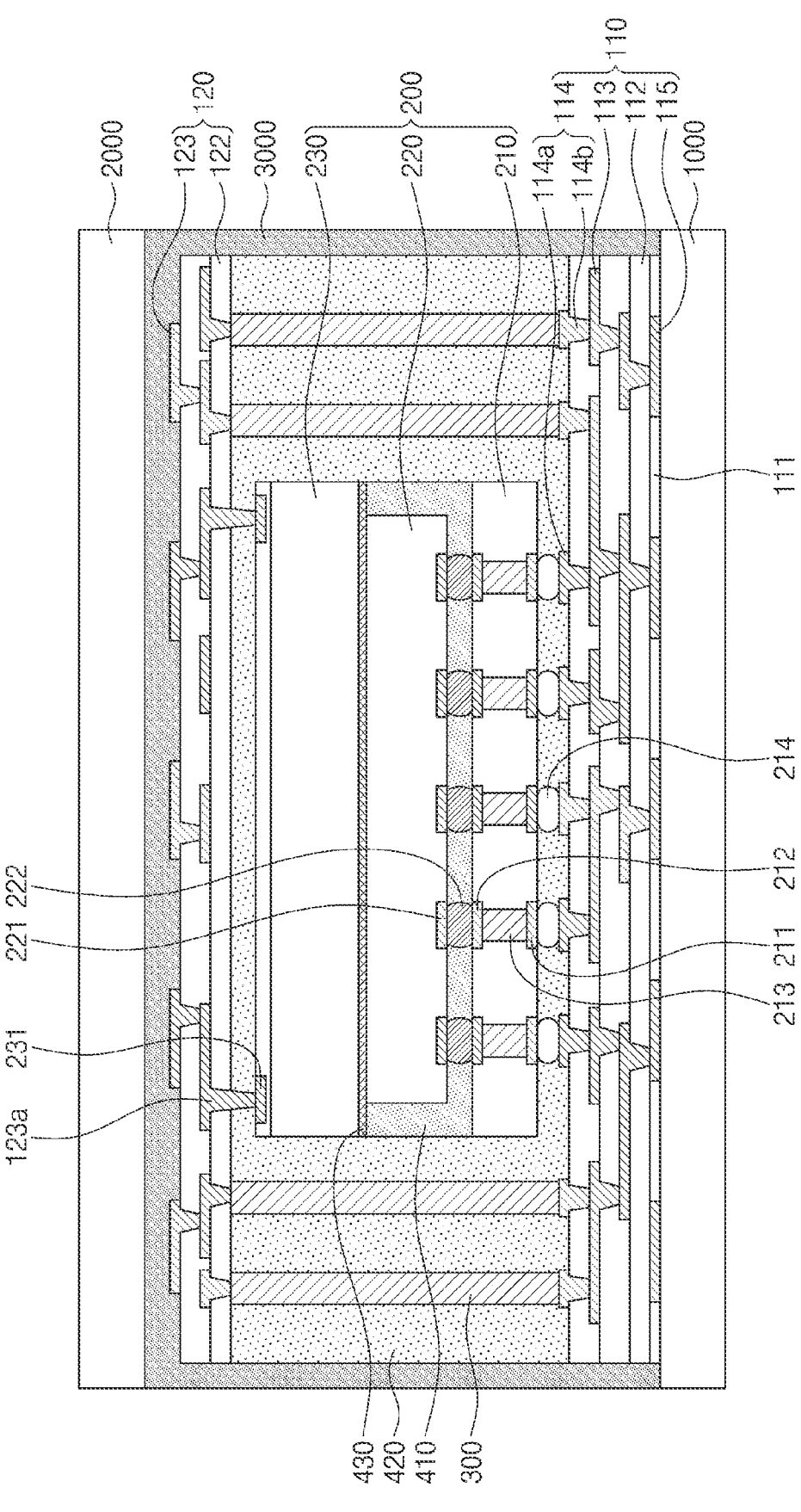

Referring to FIG. 13, an adhesive 3000 may be formed on the first carrier substrate 1000. The adhesive 3000 may be formed to cover or be on the upper surface of the first carrier substrate 1000, the side surfaces of the first redistribution substrate 110, the side surfaces of the first molding layer 420, the side surfaces and the upper surface of the second redistribution substrate 120. A second carrier substrate 2000 may be formed on an upper surface of the adhesive 3000. The adhesive 3000 may be formed to attach the second carrier substrate 2000 on the second redistribution substrate 120. The adhesive 3000 may include a material that does not damage the second redistribution substrate 120.

Figure 14:
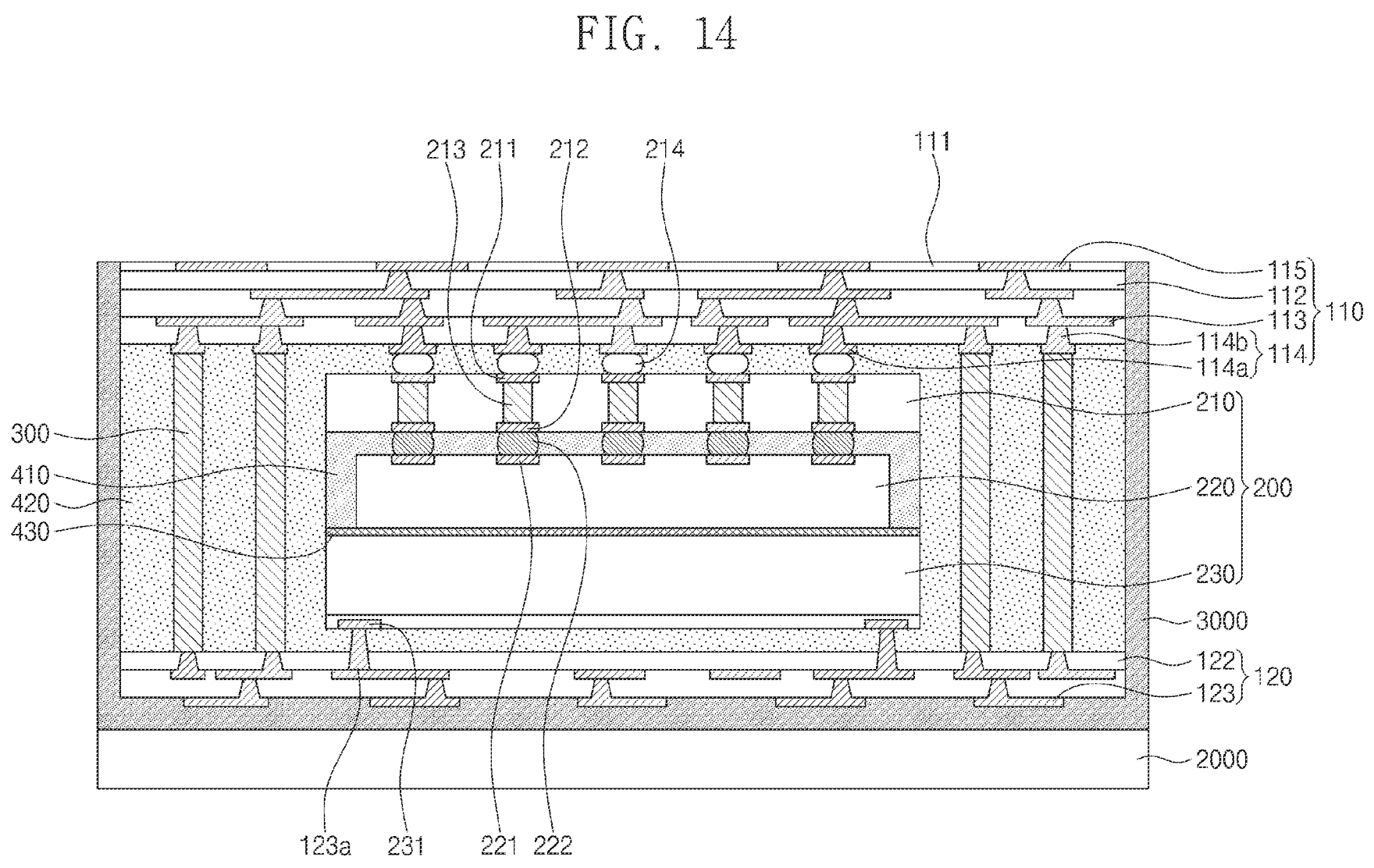

Referring to FIG. 14, a process of turning the semiconductor package upside down may be performed to perform a manufacturing process on the lower surface of the first redistribution substrate 110 described with reference to FIG. 13. Subsequently, the first carrier substrate 1000 on the upper surface of the first redistribution substrate 110 may be removed, and the uppermost first insulating layer 112 and the uppermost first substrate pads 115 of the first redistribution substrate 110 may be exposed.

Figure 15:
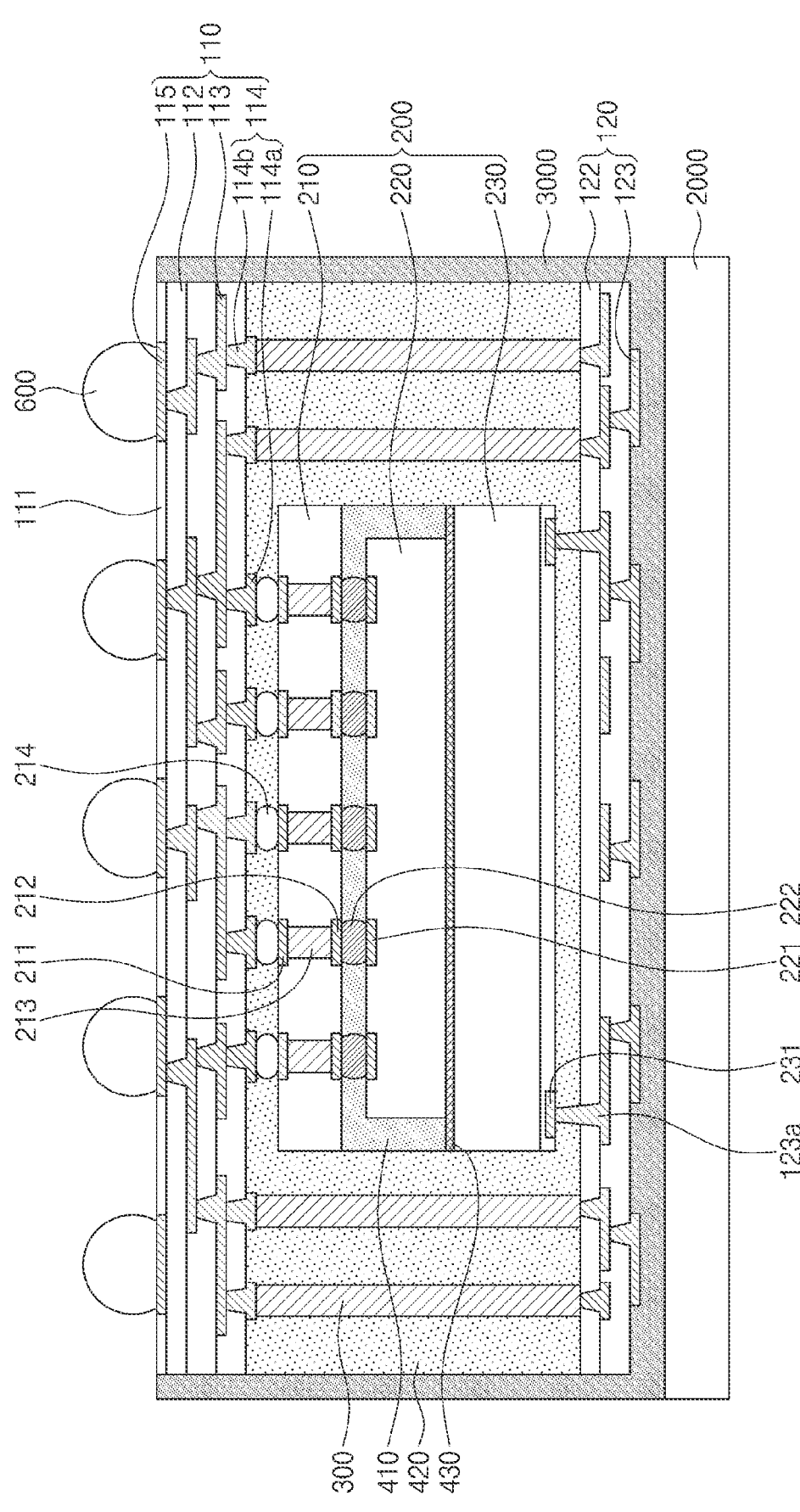

Referring to FIG. 15, external connection terminals 600 may be formed on upper surfaces of the first substrate pads 115 of the first redistribution substrate 110. Each of the external connection terminals 600 may be connected to each of the first substrate pads 115. The external connection terminals 600 may include a solder material. For example, the external connection terminals 600 may include tin (Sn), bismuth (Bi), lead (Pb), silver (Ag), or an alloy thereof.

Referring back to FIG. 1, after the external connection terminals 600 are formed, the second carrier substrate 2000 and the adhesive agent 3000 may be sequentially removed. Accordingly, the semiconductor package 10 may be manufactured.

Figure 16:
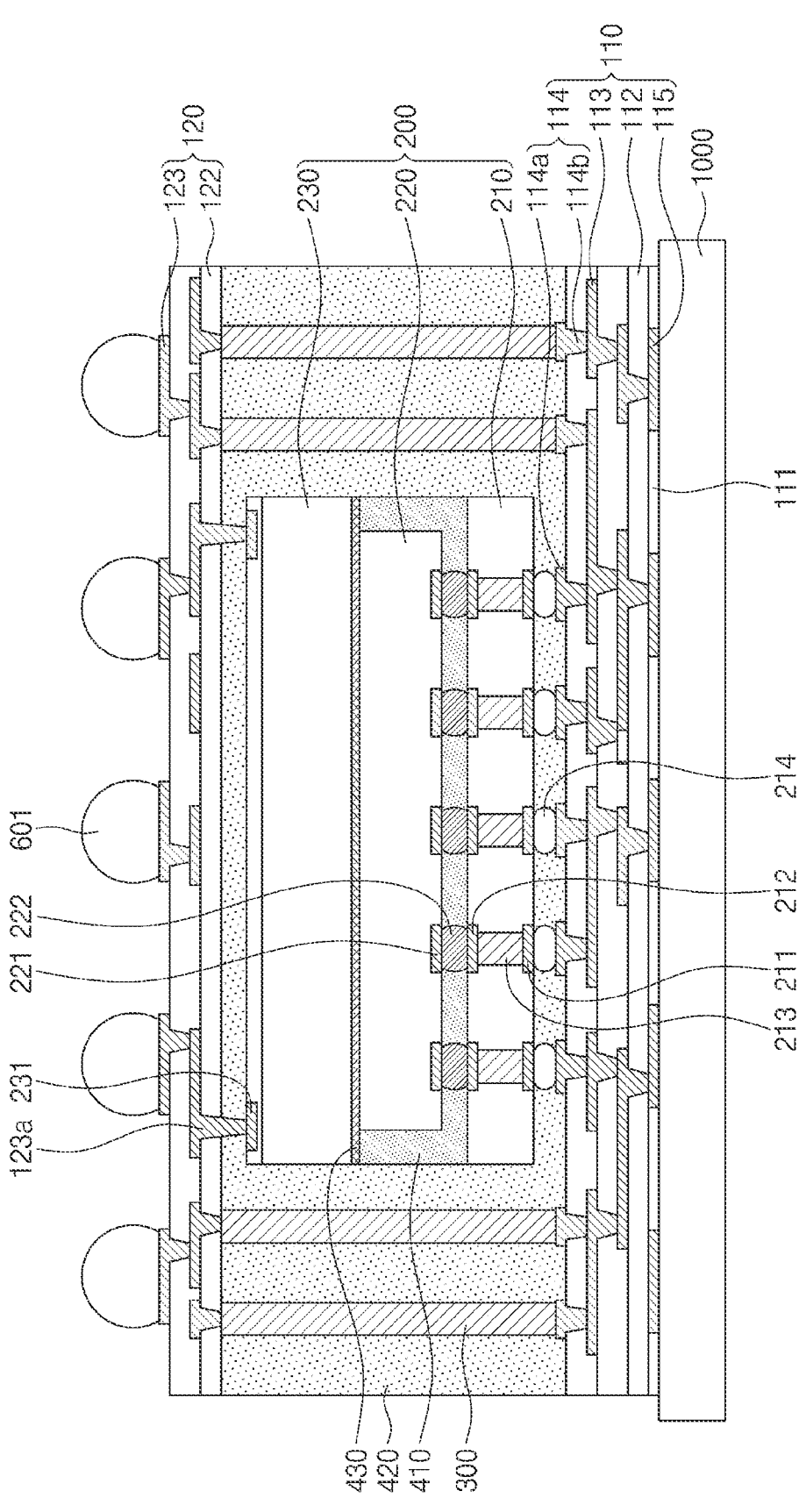
FIGS. 16 and 17 are cross-sectional views illustrating a method of manufacturing a semiconductor package according to some embodiments of the inventive concept.
Figure 17:
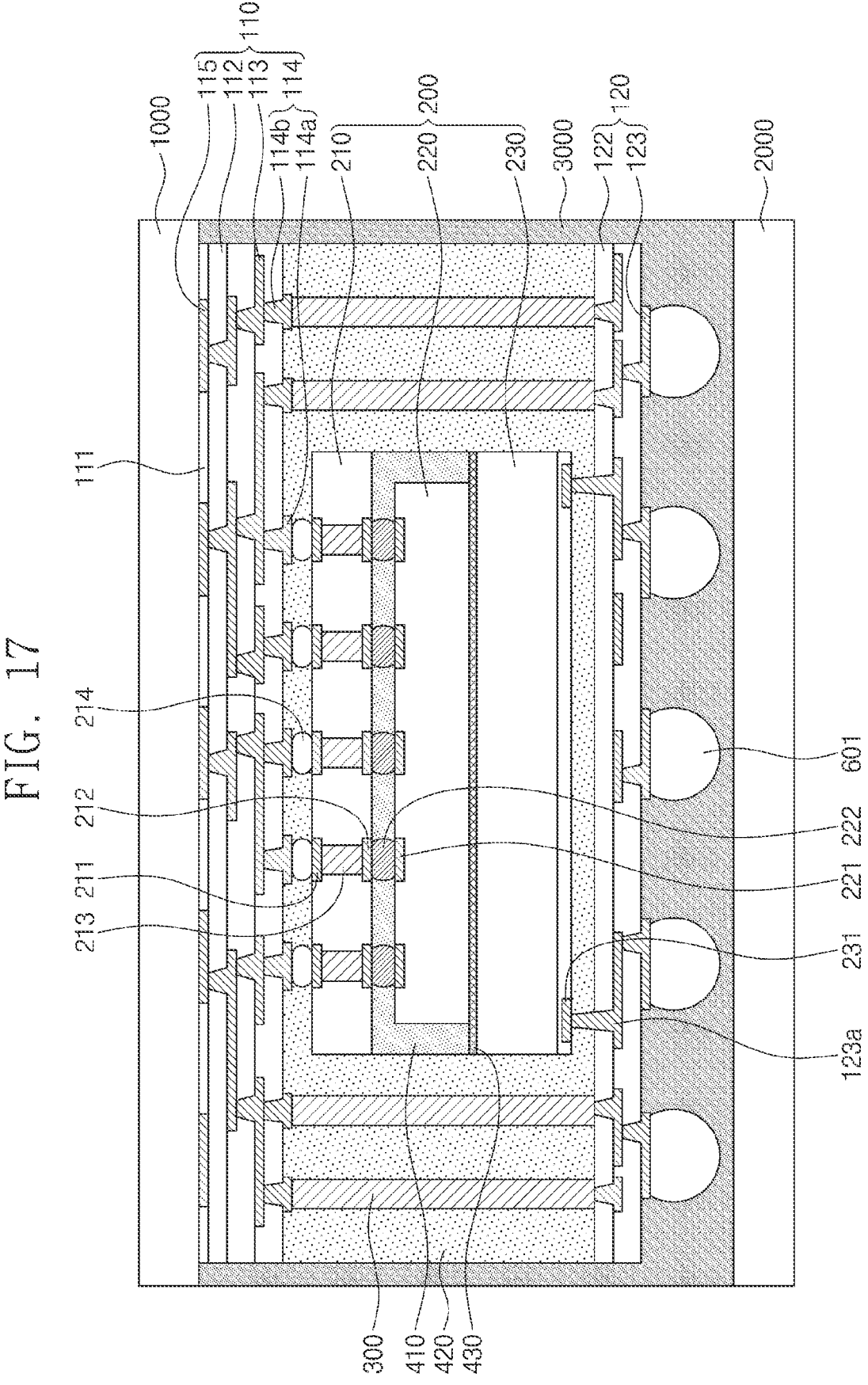

FIGS. 16 and 17 are cross-sectional views illustrating a method of manufacturing a semiconductor package according to some embodiments of the inventive concept. Hereinafter, the contents overlapping with the above-described contents will be omitted, and the same components will be described using the same reference numerals.

Referring to FIG. 16, external connection terminals 601 may be formed on the upper surface of the second redistribution substrate 120 of the semiconductor package described with reference to FIG. 12. The external connection terminals 601 may be formed on the exposed second wiring portions of the second wiring patterns 123 exposed on the upper surface of the second redistribution substrate 120 and may be connected to the second wiring patterns 123. The external connection terminals 601 may include a solder material. For example, the external connection terminals 601 may include tin (Sn), bismuth (Bi), lead (Pb), silver (Ag), or an alloy thereof.

Referring to FIG. 17, the adhesive 3000 may be formed to surround or be on the upper surface of the first carrier substrate 1000 described with reference to FIG. 16, the side surfaces of the first redistribution substrate 110, the side surfaces of the first molding layer 420, and the upper surface and the side surfaces of the second redistribution substrate 120, and the external connection terminals 601. The second carrier substrate 2000 may be formed on the adhesive 3000 formed on the second redistribution substrate 120. The adhesive 3000 may be formed to prevent damage to the external connection terminals 601 and the second redistribution substrate 120. The adhesive 3000 may be formed to attach the second carrier substrate 2000 on the external connection terminals 601. The second carrier substrate 2000 may be attached to turn the semiconductor package shown in FIG. 16 upside down. The adhesive 3000 may include a material that does not damage the second redistribution substrate 120 and the external connection terminals 601.

Referring back to FIG. 4, the first carrier substrate 1000, the second carrier substrate 2000, and the adhesive 3000 may be removed from the semiconductor package described with reference to FIG. 17. Accordingly, the semiconductor package 20 may be manufactured.

Figure 18:
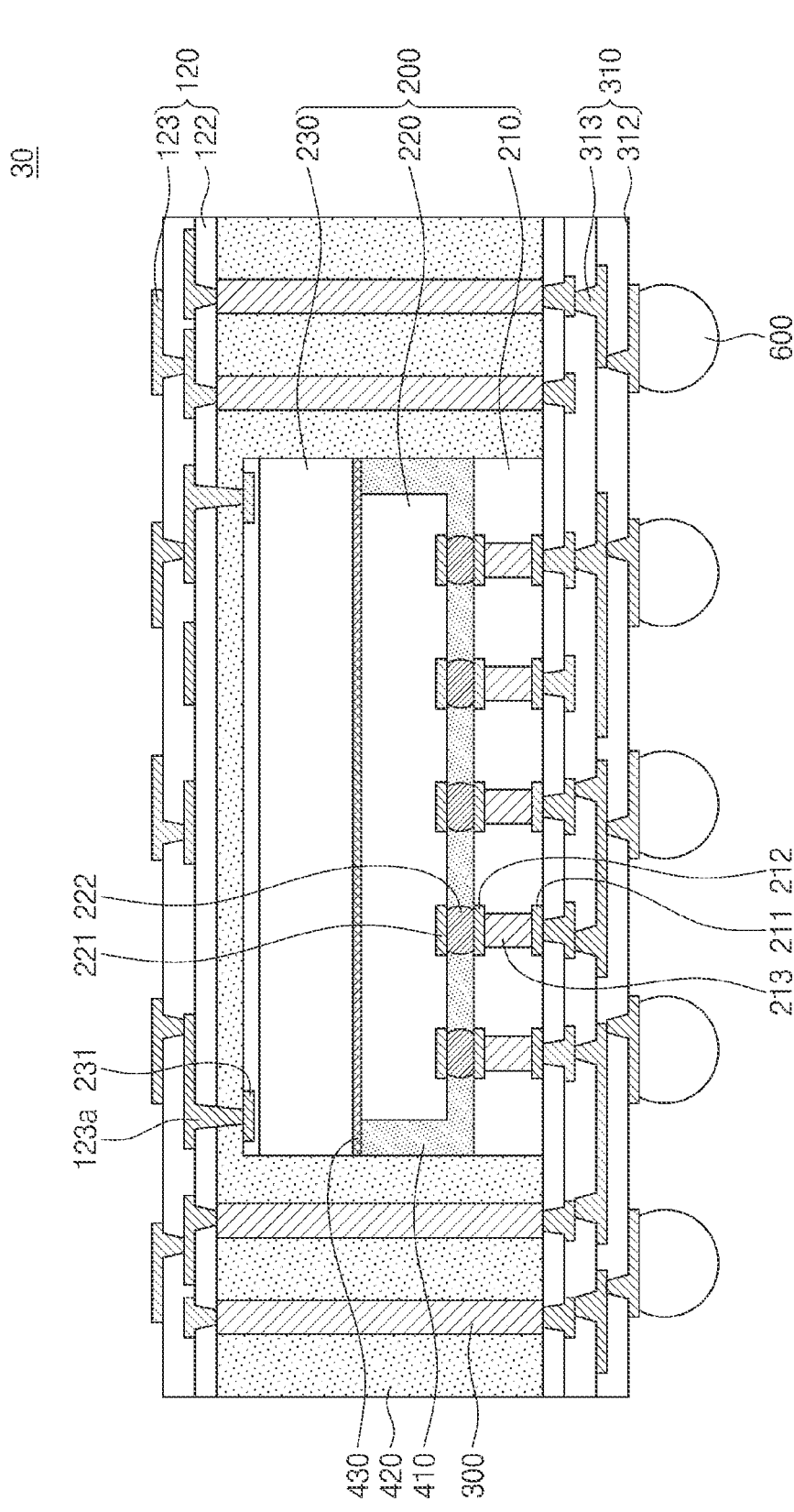
FIGS. 18 and 19 are cross-sectional views of semiconductor packages according to some embodiments of the inventive concept.

FIG. 18 is a cross-sectional view illustrating a semiconductor package according to some embodiments of the inventive concept. Hereinafter, the contents overlapping with the above-described contents will be omitted, and the same components will be described using the same reference numerals.

Referring to FIG. 18, a semiconductor package 30 may include a first redistribution substrate 310, external connection terminals 600, a first semiconductor chip 210, a second semiconductor chip 220, and a third semiconductor chip 230, a second molding layer 410, a first molding layer 420, through electrodes 300, and a second redistribution substrate 120.

The semiconductor package 30 may include the first redistribution substrate 310. The first redistribution substrate 310 may include a first insulating layer 312 and first wiring patterns 313. A plurality of first insulating layers 312 and first wiring patterns 313 may be stacked on the first redistribution substrate 310. However, the first redistribution substrate 310 may not include the first substrate pads 115 (refer to FIG. 1). The first redistribution substrate 310 may be in contact with the lower chip pads 211 and the first molding layer 420. For example, the uppermost first insulating layer 312 may be in direct contact with the lower surface of the first semiconductor chip 210, the lower surface of the lower chip pads 211, and the lower surface of the first molding layer 420. Accordingly, the first chip connection terminals 214 (refer to FIG. 1) connecting the first redistribution substrate 310 and the first semiconductor chip 210 may not be provided. Also, the first wiring patterns 313 may be in direct contact with the through electrodes 300 on the upper surface of the first redistribution substrate 310.

The first wiring patterns 313 may be provided in the first insulating layer 312. Each of the first wiring patterns 313 may have a first via portion and a first wiring portion integrally connected to each other. The first wiring portion may be a pattern for horizontal connection in the first redistribution substrate 310. The first via portion may be a portion that vertically connects the first wiring patterns 313 in the first insulating layers 312. The first via portion may have a shape in which a width becomes narrower in a direction toward the first semiconductor chip 210. The first via portion may be provided on the first wiring portion. The first wiring portion may be connected to the first via portion without an interface. A width of the first wiring portion may be greater than a width of the first via portion. That is, each of the first wiring patterns 313 may have an upside down T-shaped cross-section. The first via portions of the first wiring patterns 313 may be exposed on the upper surface of the first insulating layer 312. The first wiring portions of the first wiring patterns 313 may be exposed on the lower surface of the first insulating layer 312. The first via portions of the first wiring patterns 313 may be connected to the first wiring portions of other first wiring patterns 313 disposed thereon. The first wiring patterns 313 may include a conductive material. For example, the first wiring patterns 313 may include copper (Cu).

The external connection terminals 600 may be disposed on the lowermost surfaces of the first wiring patterns 313. The lowermost first wiring patterns 313 of the first redistribution substrate 310 may function as pads of the external connection terminals 600. Differently from that shown, the external connection terminals 600 may be disposed on the upper surfaces of the second wiring patterns 123 exposed on the upper surface of the second redistribution substrate 120. In this case, the uppermost second wiring patterns 123 of the second redistribution substrate 120 may function as pads of the external connection terminals 600.

Differently from the method of manufacturing the semiconductor package described with reference to FIGS. 5 to 15, the semiconductor package 30 may be formed through a chip first process in which the first redistribution substrate 310 is formed on the lower surface of the first semiconductor chip 210.

The first semiconductor chip 210, the second semiconductor chip 220, the third semiconductor chip 230, the second molding layer 410, the first molding layer 420, and the through electrodes 300, and the second redistribution substrate 120 of the semiconductor package 30 may be the same as or similar to those of the semiconductor package 10 described with reference to FIG. 1.

Figure 19:
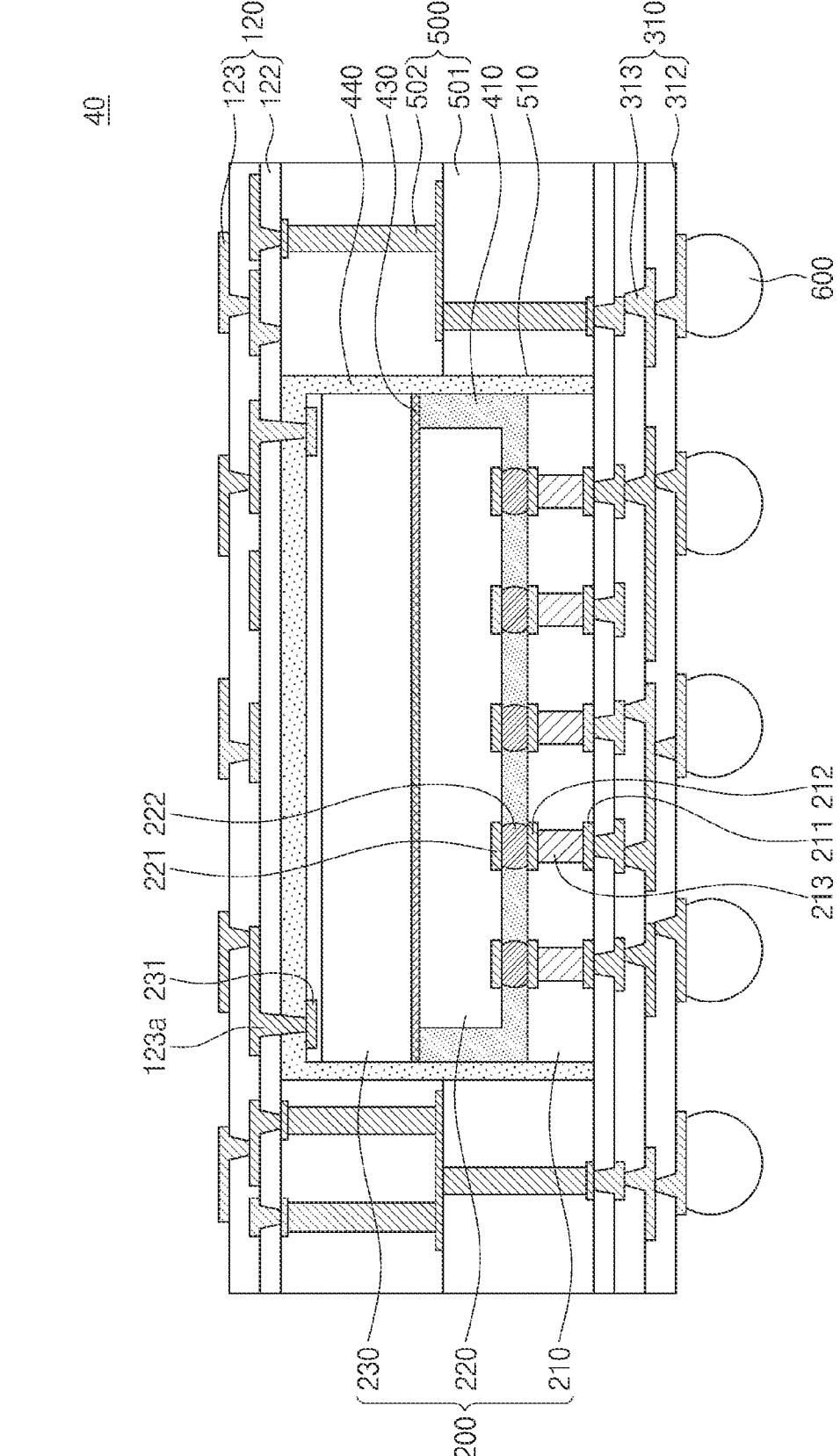

FIG. 19 is a cross-sectional view illustrating a semiconductor package according to some embodiments of the inventive concept. Hereinafter, the contents overlapping with the above-described contents will be omitted, and the same components will be described using the same reference numerals.

Referring to FIG. 19, a semiconductor package 40 may include a first redistribution substrate 310. A connection substrate 500 may be disposed on an upper surface of the first redistribution substrate 310. The connection substrate 500 may have a connection substrate opening 510 penetrating or extending into the connection substrate 500. The connection substrate opening 510 may have an open hole shape connecting upper and lower surfaces of the connection substrate 500. The lower surface of the connection substrate 500 may be in contact with the upper surface of the first redistribution substrate 310. The upper surface of the connection substrate 500 may be in contact with a lower surface of the second redistribution substrate 120. The lower surface of the connection substrate 500 may be coplanar with the lower surface of the first semiconductor chip 210. The connection substrate 500 may include an insulating pattern 501 and conductive patterns 502. The conductive patterns 502 may be disposed to be spaced apart from the connection substrate opening 510. The conductive patterns 502 may be disposed outside the connection substrate opening 510. An outer side may be a region between the connection substrate opening 510 and a side surface of the first redistribution substrate 310. The conductive patterns 502 may vertically penetrate or extend into the insulating pattern 501. The conductive patterns 502 may vertically penetrate or extend into the insulating pattern 501 to be electrically connected to the first wiring patterns 313 of the first redistribution substrate 310. The first semiconductor chip 210, the second semiconductor chip 220, and the third semiconductor chip 230 may be provided in the connection substrate opening 510.

A third molding layer 440 may be provided in the connection substrate opening 510 on the first redistribution substrate 310. The third molding layer 440 may be provided between the first semiconductor chip 210, the second semiconductor chip 220, and the third semiconductor chip 230, and the connection substrate 500. A lower surface of the third molding layer 440 may be in contact with the upper surface of the first redistribution substrate 310.

The second redistribution substrate 120 may be provided on the connection substrate 500. The second wiring pattern 123 of the second redistribution substrate 120 may be electrically connected to the conductive patterns 502. The conductive patterns 502 may be a connection structure connecting the first redistribution substrate 310 and the second redistribution substrate 120. The first redistribution substrate 310 and the second redistribution substrate 120 may be electrically connected to each other through the conductive patterns 502.

External connection terminals 600 may be disposed on the lower surfaces of the lowermost first wiring patterns 313 among the first wiring patterns 313 of the first redistribution substrate 310. The lowermost first wiring patterns 313 of the first redistribution substrate 310 may function as pads of the external connection terminals 600. Differently from that shown in FIG. 19, the external connection terminals 600 may be disposed on the upper surfaces of the second wiring patterns 123 exposed on the upper surface of the second redistribution substrate 120. In this case, the uppermost second wiring patterns 123 of the second redistribution substrate 120 may function as pads of the external connection terminals 600.

The first semiconductor chip 210, the second semiconductor chip 220, the third semiconductor chip 230, and the second redistribution substrate 120 of the semiconductor package 40 may be the same as or similar to the components of the semiconductor package 10 described with reference to FIG. 1. The first redistribution substrate 310 and the external connection terminals 600 of the semiconductor package 40 may be the same as or similar to the components of the semiconductor package 30 described with reference to FIG. 18.

In the semiconductor package according to some embodiments of the inventive concept, the first semiconductor chip and the second semiconductor chip may constitute the three-dimensional integrated circuit, and the third semiconductor chip on the upper surface thereof may be sequentially stacked between the first and second redistribution substrates. Accordingly, the integration of the semiconductor package may be improved.

In addition, the uppermost third semiconductor chip of the stacked semiconductor chips may be directly electrically connected to the redistribution substrate provided on the third semiconductor chip, and thus, the electrical connection distance between the third semiconductor chip and the redistribution substrate may be shortened. Accordingly, the electrical characteristics of the semiconductor package may be improved.

As used herein, the words "include/comprise", "contain", "have", and any other variations specify the presence of the stated features, steps, operations, elements, and/or components, but do not preclude the presence or addition of one or more other features, steps, operations, elements, components, and/or groups thereof.

While embodiments are described above, a person skilled in the art may understand that many modifications and variations are made without departing from the scope of the inventive concept defined in the following claims. Accordingly, the example embodiments of the inventive concept should be considered in all respects as illustrative and not restrictive, with the scope of the inventive concept being indicated by the appended claims.

What is claimed is:

1. A semiconductor package comprising:
a first redistribution substrate;
a second redistribution substrate on the first redistribution substrate;
a chip stack between the first redistribution substrate and the second redistribution substrate;
a first molding layer on the chip stack; and
a through electrode that extends into the first molding layer and electrically connects the first redistribution substrate to the second redistribution substrate,
wherein the chip stack comprises:
a first semiconductor chip on the first redistribution substrate, the first semiconductor chip including a through via that extends through the first semiconductor chip;
a chip structure that includes a second semiconductor chip and a second molding layer, the second semiconductor chip being on the first semiconductor chip and electrically connected to the through via; and
a third semiconductor chip between the chip structure and the second redistribution substrate,
wherein a side surface of the first semiconductor chip is coplanar with a side surface of the chip structure.

2. The semiconductor package of claim 1, wherein the second molding layer is between the first semiconductor chip and the second semiconductor chip, and
wherein the second molding layer is in contact with an upper surface of the first semiconductor chip and a lower surface of the second semiconductor chip.

3. The semiconductor package of claim 2, wherein the second molding layer of the chip structure is on side surfaces of the second semiconductor chip.

4. The semiconductor package of claim 1, wherein the second redistribution substrate includes an insulating layer and wiring patterns in the insulating layer,
wherein the third semiconductor chip includes a chip pad thereon, and
wherein at least one of the wiring patterns extends toward the third semiconductor chip and is in contact with the chip pad of the third semiconductor chip.

5. The semiconductor package of claim 1, wherein the second semiconductor chip includes a first active surface and a first rear surface opposite to the first active surface,
wherein the third semiconductor chip includes a second active surface and a second rear surface opposite to the second active surface,
wherein the first active surface faces the first redistribution substrate, and
wherein the second active surface faces the second redistribution substrate.

6. The semiconductor package of claim 5, wherein the first rear surface and the second rear surface are attached to each other by an adhesive member.

7. The semiconductor package of claim 1, further comprising:
first chip connection terminals between the first semiconductor chip and the first redistribution substrate; and
second chip connection terminals between the first semiconductor chip and the second semiconductor chip.

8. The semiconductor package of claim 1, further comprising external connection terminals on either a lower surface of the first redistribution substrate or an upper surface of the second redistribution substrate.

9. A semiconductor package comprising:
a first redistribution substrate;
a first semiconductor chip on the first redistribution substrate, the first semiconductor chip including a through via that extends through the first semiconductor chip;
a chip structure on the first semiconductor chip, the chip structure including a second semiconductor chip;
a third semiconductor chip on the chip structure;
a second redistribution substrate on the third semiconductor chip;
a connection structure that electrically connects the first redistribution substrate to the second redistribution substrate; and
a first molding layer on the first semiconductor chip, the chip structure, and the third semiconductor chip,
wherein the second redistribution substrate includes an insulating layer and wiring patterns in the insulating layer,
wherein the third semiconductor chip includes a chip pad thereon, and
wherein at least one of the wiring patterns extends into the first molding layer and the insulating layer and is electrically connected to the chip pad of the third semiconductor chip.

10. The semiconductor package of claim 9, further comprising:
first chip connection terminals between the first redistribution substrate and the first semiconductor chip; and
second chip connection terminals between the first semiconductor chip and the chip structure.

11. The semiconductor package of claim 9, wherein the chip structure further includes a second molding layer between the first semiconductor chip and the second semiconductor chip, and wherein a lower surface of the second molding layer is in contact with an upper surface of the first semiconductor chip.

12. The semiconductor package of claim 9, wherein the second semiconductor chip includes a first active surface and a first rear surface opposite to the first active surface, wherein the third semiconductor chip includes a second active surface and a second rear surface opposite to the second active surface, wherein the first rear surface of the second semiconductor chip and the second rear surface of the third semiconductor chip face each other.

13. The semiconductor package of claim 12, wherein the first rear surface and the second rear surface are attached to each other by an adhesive member.

14. The semiconductor package of claim 9, further comprising external connection terminals on either a lower surface of the first redistribution substrate or an upper surface of the second redistribution substrate.

15. The semiconductor package of claim 9, wherein a side surface of the third semiconductor chip is coplanar with a side surface of the first semiconductor chip.

16. A semiconductor package comprising:

a first redistribution substrate;

a second redistribution substrate on the first redistribution substrate;

a chip stack between the first redistribution substrate and the second redistribution substrate;

a first molding layer on the chip stack; and a through electrode that extends into the first molding layer and electrically connects the first redistribution substrate to the second redistribution substrate, wherein the chip stack comprises:

a first semiconductor chip on the first redistribution substrate, the first semiconductor chip having a through via that extends through the first semiconductor chip;

a second semiconductor chip on the first semiconductor chip, the second semiconductor chip being electrically connected to the through via;

a second molding layer between the second semiconductor chip and the first semiconductor chip; and a third semiconductor chip on the second semiconductor chip and the second molding layer, the third semiconductor chip being between the second redistribution substrate and the second semiconductor chip.

17. The semiconductor package of claim 16, wherein the second redistribution substrate includes an insulating layer and wiring patterns in the insulating layer, wherein the third semiconductor chip includes a chip pad on an upper surface of the third semiconductor chip, and wherein at least one of the wiring patterns is in direct contact with the chip pad of the third semiconductor chip.

18. The semiconductor package of claim 16, wherein the second molding layer is on a lower surface and side surfaces of the second semiconductor chip, wherein a lower surface of the second molding layer is in contact with an upper surface of the first semiconductor chip, and wherein a side surface of the second molding layer is coplanar with a side surface of the first semiconductor chip.

19. The semiconductor package of claim 16, wherein the second semiconductor chip includes a first active surface and a first rear surface opposite to the first active surface, wherein the third semiconductor chip includes a second active surface and a second rear surface opposite to the second active surface, wherein the first active surface faces the first redistribution substrate, and wherein the second active surface faces the second redistribution substrate.

20. The semiconductor package of claim 16, further comprising external connection terminals on either a lower surface of the first redistribution substrate or an upper surface of the second redistribution substrate.

* * * * *